(12) United States Patent
Song

(10) Patent No.: US 9,356,018 B2
(45) Date of Patent: May 31, 2016

(54) SEMICONDUCTOR DEVICES AND METHODS OF FABRICATING THE SAME

(71) Applicant: Samsung Electronics Co., Ltd., Suwon-si, Gyeonggi-do (KR)

(72) Inventor: Hyun-Seung Song, Incheon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/674,123

(22) Filed: Mar. 31, 2015

(65) Prior Publication Data

US 2016/0020205 A1  Jan. 21, 2016

(30) Foreign Application Priority Data

Jul. 16, 2014 (KR) ........................ 10-2014-0089749

(51) Int. Cl.
| | | |
|---|---|---|
| H01L 27/11 | (2006.01) | |
| H01L 27/06 | (2006.01) | |
| H01L 49/02 | (2006.01) | |
| H01L 29/08 | (2006.01) | |
| H01L 29/16 | (2006.01) | |
| H01L 29/04 | (2006.01) | |
| H01L 29/423 | (2006.01) | |
| H01L 29/417 | (2006.01) | |

(52) U.S. Cl.
CPC ............ *H01L 27/0629* (2013.01); *H01L 28/20* (2013.01); *H01L 29/04* (2013.01); *H01L 29/0847* (2013.01); *H01L 29/16* (2013.01); *H01L 29/41775* (2013.01); *H01L 29/4232* (2013.01)

(58) Field of Classification Search
CPC .................................................. H01L 27/0629
USPC .......................................................... 257/379
See application file for complete search history.

(56) References Cited

U.S. PATENT DOCUMENTS

| 6,387,745 B1 | 5/2002 | Onoda et al. |
| 7,598,536 B2 | 10/2009 | Choi et al. |
| 2013/0161722 A1 | 6/2013 | Son et al. |
| 2013/0277752 A1 | 10/2013 | Glass et al. |

FOREIGN PATENT DOCUMENTS

| JP | 2012-191092 A | 10/2012 |
| JP | 2013-187325 | 9/2013 |
| JP | 2013-187326 | 9/2013 |
| JP | 2013-197515 | 9/2013 |
| KR | 2004-0016679 A | 2/2004 |
| KR | 2004-0108501 A | 12/2004 |

*Primary Examiner* — Anthony Ho
(74) *Attorney, Agent, or Firm* — Myers Bigel & Sibley, P.A.

(57) ABSTRACT

Provided is a semiconductor device including a substrate, first and second gate structures provided on the substrate, a source/drain region provided adjacent to the first gate structure, an interlayered insulating layer provided on the substrate to cover the source/drain region and the first and second gate structures, a source/drain contact hole penetrating the interlayered insulating layer and exposing the source/drain region, a trench formed in the interlayered insulating layer to expose a top surface of the second gate structure, a source/drain contact plug provided in the source/drain contact hole to be in contact with the source/drain region, and a resistor pattern provided in the trench to be in contact with a top surface of the second gate structure.

19 Claims, 26 Drawing Sheets

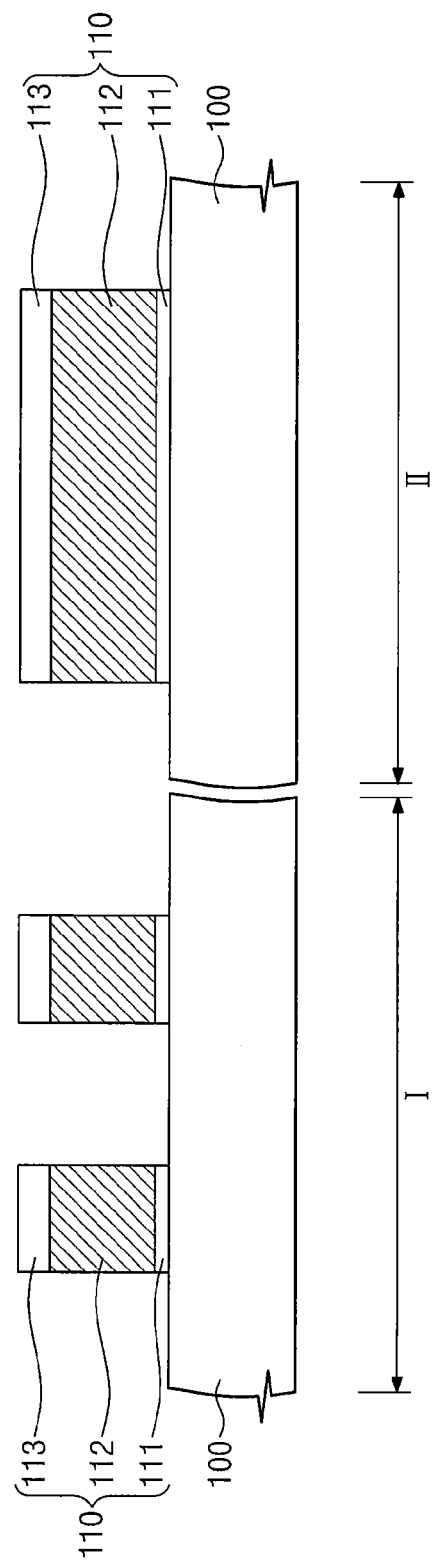

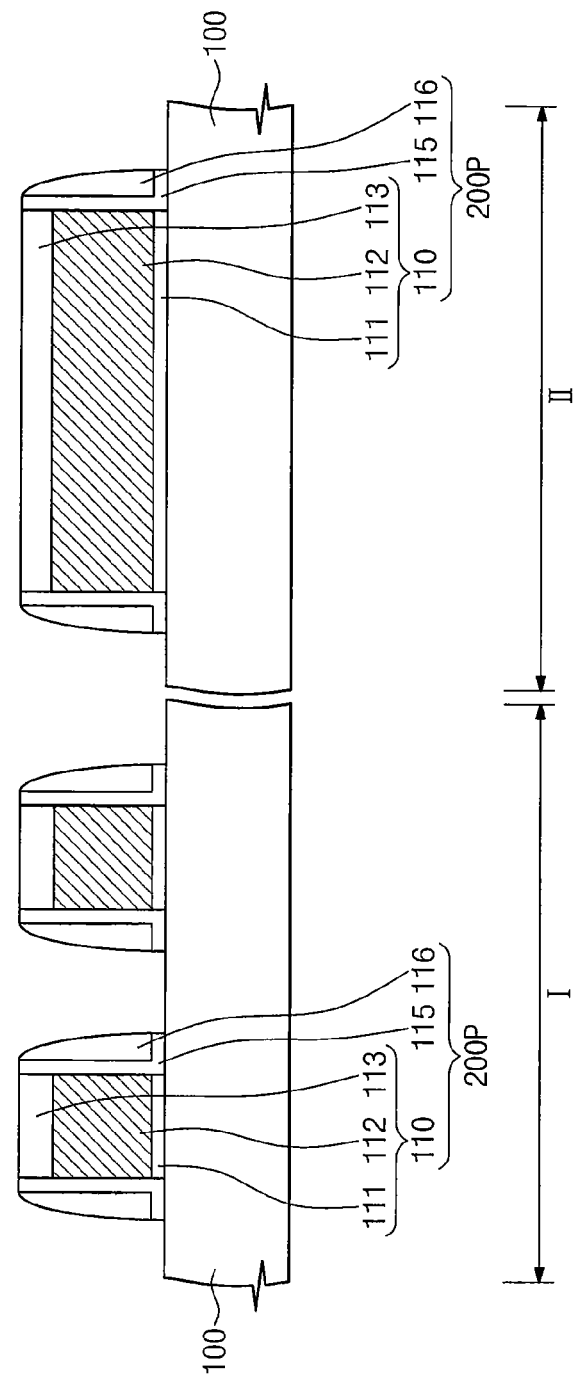

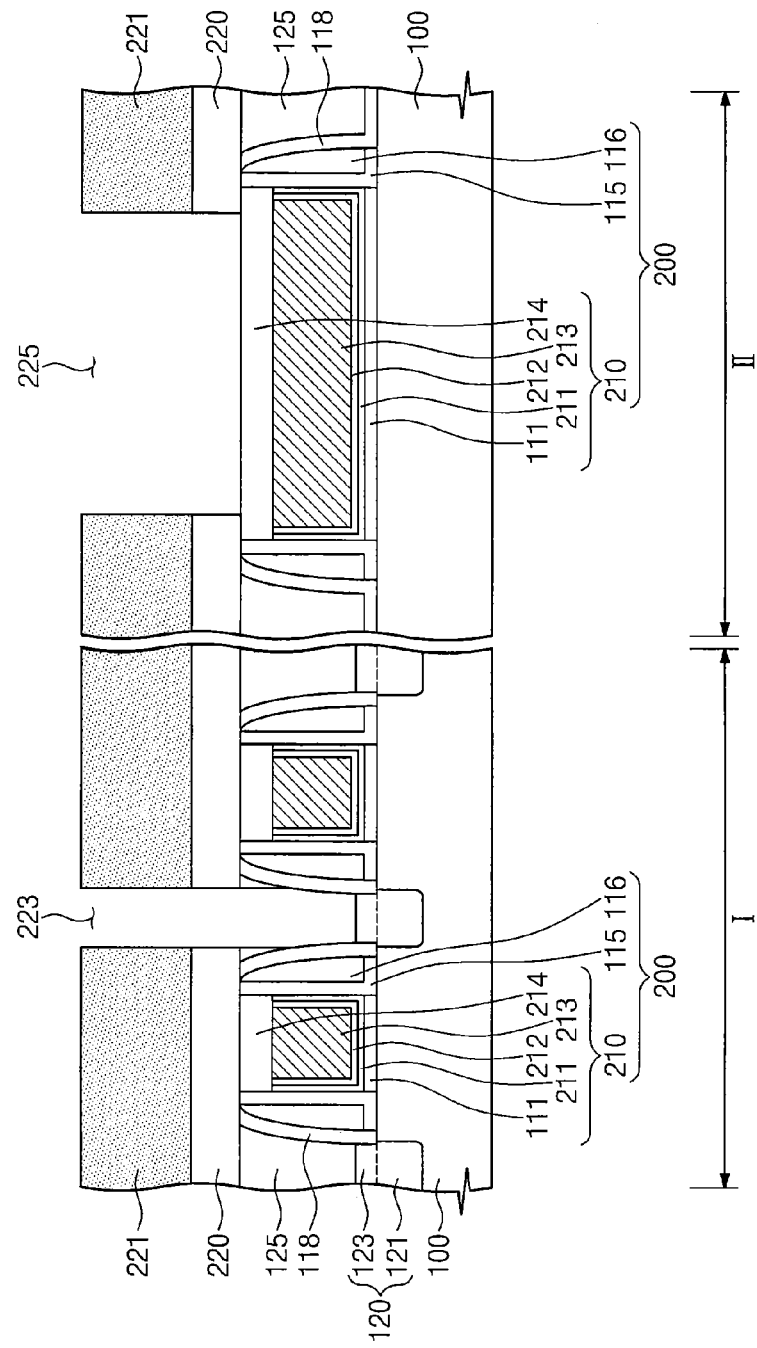

SEMICONDUCTOR DEVICES AND METHODS OF FABRICATING THE SAME

CROSS-REFERENCE TO RELATED APPLICATION

This U.S. non-provisional patent application claims priority under 35 U.S.C. §119 to Korean Patent Application No. 10-2014-0089749, filed on Jul. 16, 2014, in the Korean Intellectual Property Office, the disclosure of which is hereby incorporated by reference herein in its entirety.

BACKGROUND OF THE INVENTION

Example embodiments of the inventive concept relate to a semiconductor device and a method of fabricating the same, and in particular, to a semiconductor device with a resistor pattern and a method of fabricating the same.

A doped polysilicon layer has been used for a resistor pattern of a semiconductor device. However, in order to improve performance of a semiconductor device, a metal gate has become more and more widely used, and thus, a technology of using a metal layer for the resistor pattern is being developed. Accordingly, there is an increasing demand for a method for precisely forming a resistor pattern with a high property.

SUMMARY

Example embodiments of the inventive concept provide a semiconductor device with a metal resistor pattern.

Example embodiments of the inventive concept provide a method of fabricating a semiconductor device with a metal resistor pattern.

According to example embodiments of the inventive concept, a semiconductor device may include a substrate, a first gate structure and a second gate structure provided on the substrate, a source/drain region provided adjacent to the first gate structure, an interlayered insulating layer provided on the substrate to cover the source/drain region and the first and second gate structures, a source/drain contact hole penetrating the interlayered insulating layer and exposing the source/drain region, a trench formed in the interlayered insulating layer to expose a top surface of the second gate structure, a source/drain contact plug provided in the source/drain contact hole to be in contact with the source/drain region, and a resistor pattern provided in the trench to be in contact with a top surface of the second gate structure.

In example embodiments, each of the first and second gate structures may include a gate electrode, an inner gate spacer provided on a side surface of the gate electrode, and an outer gate spacer provided on a side surface of the inner gate spacer.

In example embodiments, the gate electrode may include a gate insulating pattern, a high-k dielectric pattern, a gate barrier pattern, a gate conductive pattern, and a gate capping pattern.

In example embodiments, the gate capping pattern may be in direct contact with the resistor pattern.

In example embodiments, the source/drain region may include a lower source/drain region and an upper source/drain region.

In example embodiments, the lower source/drain region may be formed in the substrate and contains impurity atoms.

In example embodiments, the upper source/drain region may include a single crystalline silicon layer epitaxially grown from the lower source/drain region and may be formed to protrude upward from a top surface of the substrate.

In example embodiments, the interlayered insulating layer may include a first interlayered insulating layer and a second interlayered insulating layer on the first interlayered insulating layer.

In example embodiments, the first interlayered insulating layer may have a top surface positioned at substantially the same level as that of the gate structure.

In example embodiments, the second interlayered insulating layer may have a top surface positioned at a higher level than that of the resistor pattern.

In example embodiments, the source/drain contact plug may have a top surface positioned at substantially the same level as that of the resistor pattern.

In example embodiments, the resistor pattern may have a top surface positioned at a lower level than that of the source/drain contact plug.

In example embodiments, the source/drain contact plug and the resistor pattern contain the same material.

According to example embodiments of the inventive concept, a semiconductor device may include a substrate, a first gate structure and a second gate structure provided on the substrate, a source/drain region formed adjacent to the first gate structure, an interlayered insulating layer covering the source/drain region and the gate structure and including a first interlayered insulating layer and a second interlayered insulating layer on the first interlayered insulating layer, a source/drain contact plug penetrating the first and second interlayered insulating layers and being in contact with the source/drain region, and a resistor pattern penetrating the second interlayered insulating layer and being in contact with the second gate structure.

In example embodiments, the source/drain contact plug may have a top surface positioned at substantially the same level as that of the resistor pattern.

In example embodiments, the source/drain contact plug may have a top surface positioned at a lower level than that of the second interlayered insulating layer.

In example embodiments, the source/drain region may include a lower source/drain region and an upper source/drain region on the lower source/drain region.

In example embodiments, the upper source/drain region may include a single crystalline silicon layer epitaxially grown from the lower source/drain region and may be formed to protrude upward from a top surface of the substrate.

In example embodiments, the resistor pattern may have a top surface positioned at a lower level than that of the second interlayered insulating layer.

According to example embodiments of the inventive concept, a semiconductor device may include a substrate including a first region and a second region, gate structures provided on the first and second regions, a source/drain contact plug provided on the first region and between the gate structures, and a resistor pattern provided on the gate structure of the second region. The source/drain contact plug may have a top surface positioned at substantially the same level as that of the resistor pattern.

BRIEF DESCRIPTION OF THE DRAWINGS

Example embodiments will be more clearly understood from the following description taken in conjunction with the accompanying drawings. The accompanying drawings represent non-limiting, example embodiments as described herein.

Figure 1:
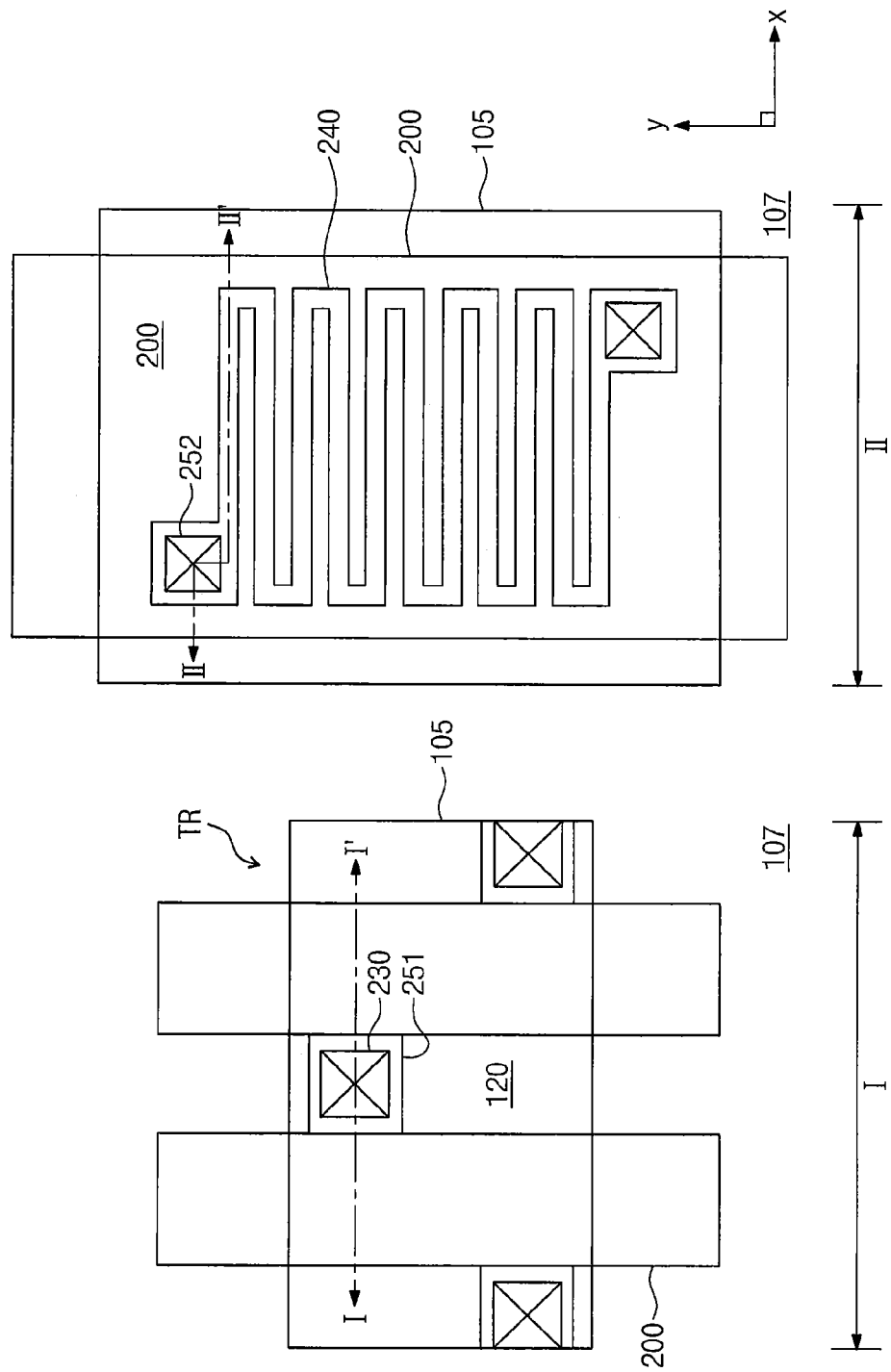
FIG. 1 is a layout schematically illustrating a portion of a semiconductor device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described with reference to the accompanying drawings, in which example embodiments are shown. Example embodiments of the inventive concepts may, however, be embodied in many different forms and should not be construed as being limited to the embodiments set forth herein. Rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements throughout the specification.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, steps, operations, elements and/or components, but do not preclude the presence or addition of one or more other features, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a layout schematically illustrating a portion of a semiconductor device according to example embodiments of the inventive concept.

Referring to FIG. 1, a semiconductor device, according to example embodiments of the inventive concept, may include a first region I and a second region II. A transistor TR may be disposed on the first region I, and a resistor pattern 240 may be disposed on the second region II.

On the first region I, an isolation region 107 may be provided to surround an active region 105, a gate structure 200 may be provided on the isolation region 107 and the active region 105, and a source/drain region 120 may be formed in the active region 105. A source/drain contact plug 230 and a first interconnection plug 251 may be further provided on the first region I in such a way that they are overlapped with the source/drain region 120.

On the second region II, the isolation region 107 may be provided to surround the active region 105, the gate structure 200 may be provided on the isolation region 107 and the active region 105, and the resistor pattern 240 may be provided on the gate structure 200. On the gate structure 200, the resistor pattern 240 may extend along an X direction and/or a Y direction. A second interconnection plug 252 may be further provided on the second region II in such a way that it is overlapped with the resistor pattern 240.

Figure 2:
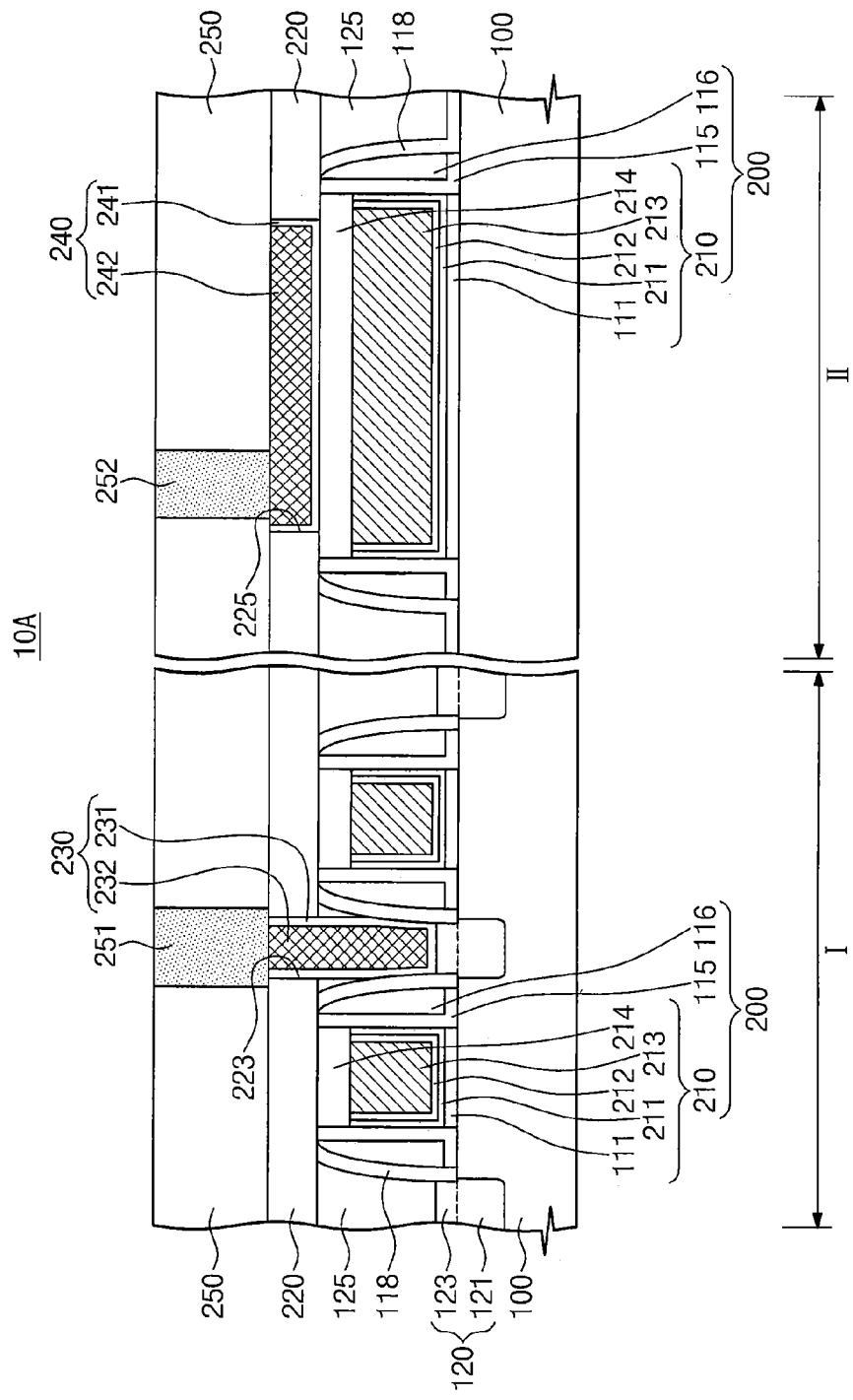
FIGS. 2 through 4 are sectional views taken along the lines I-I' and II-II' of FIG. 1 to illustrate semiconductor devices according to example embodiments of the inventive concept.
Figure 3:
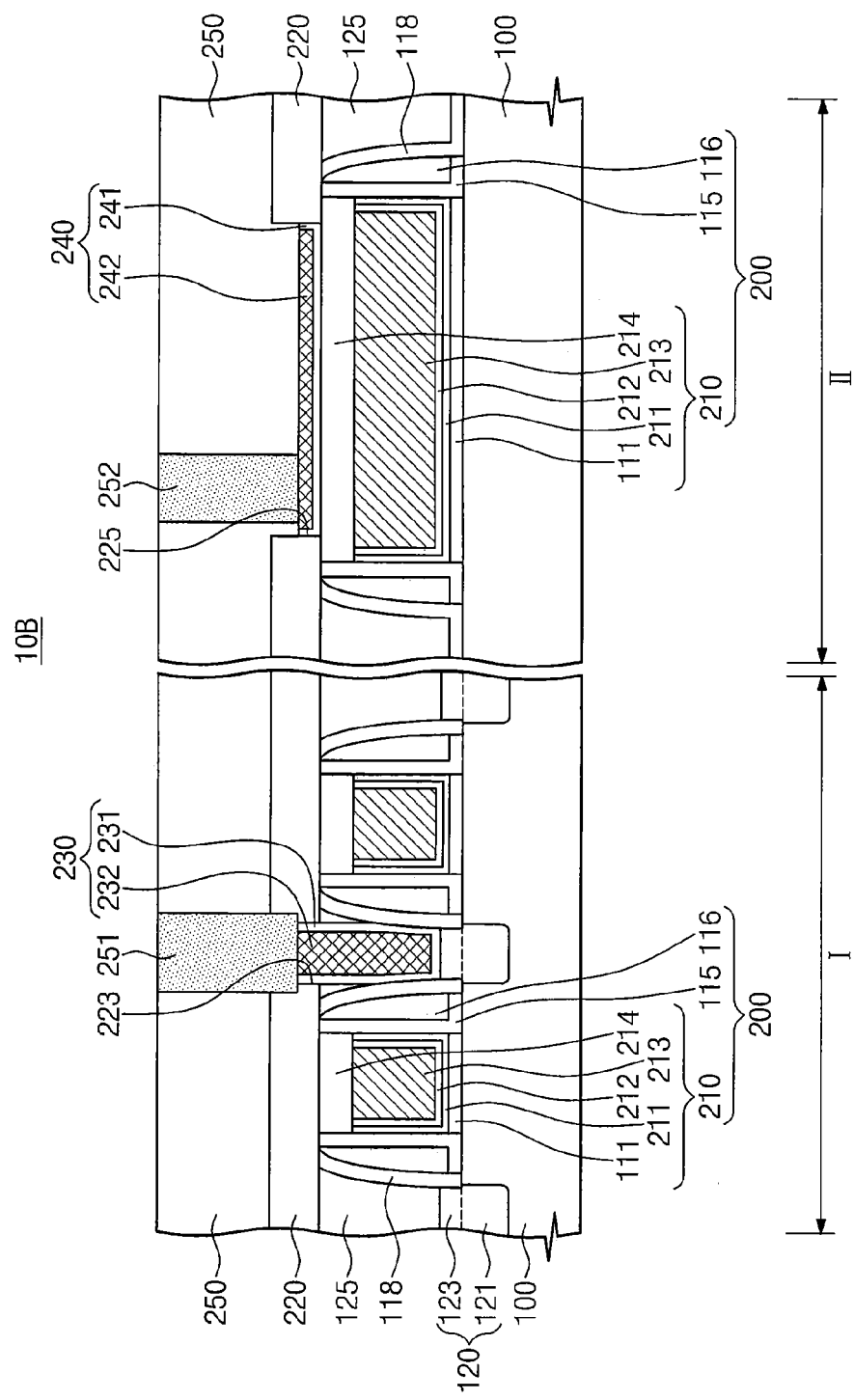
Figure 4:
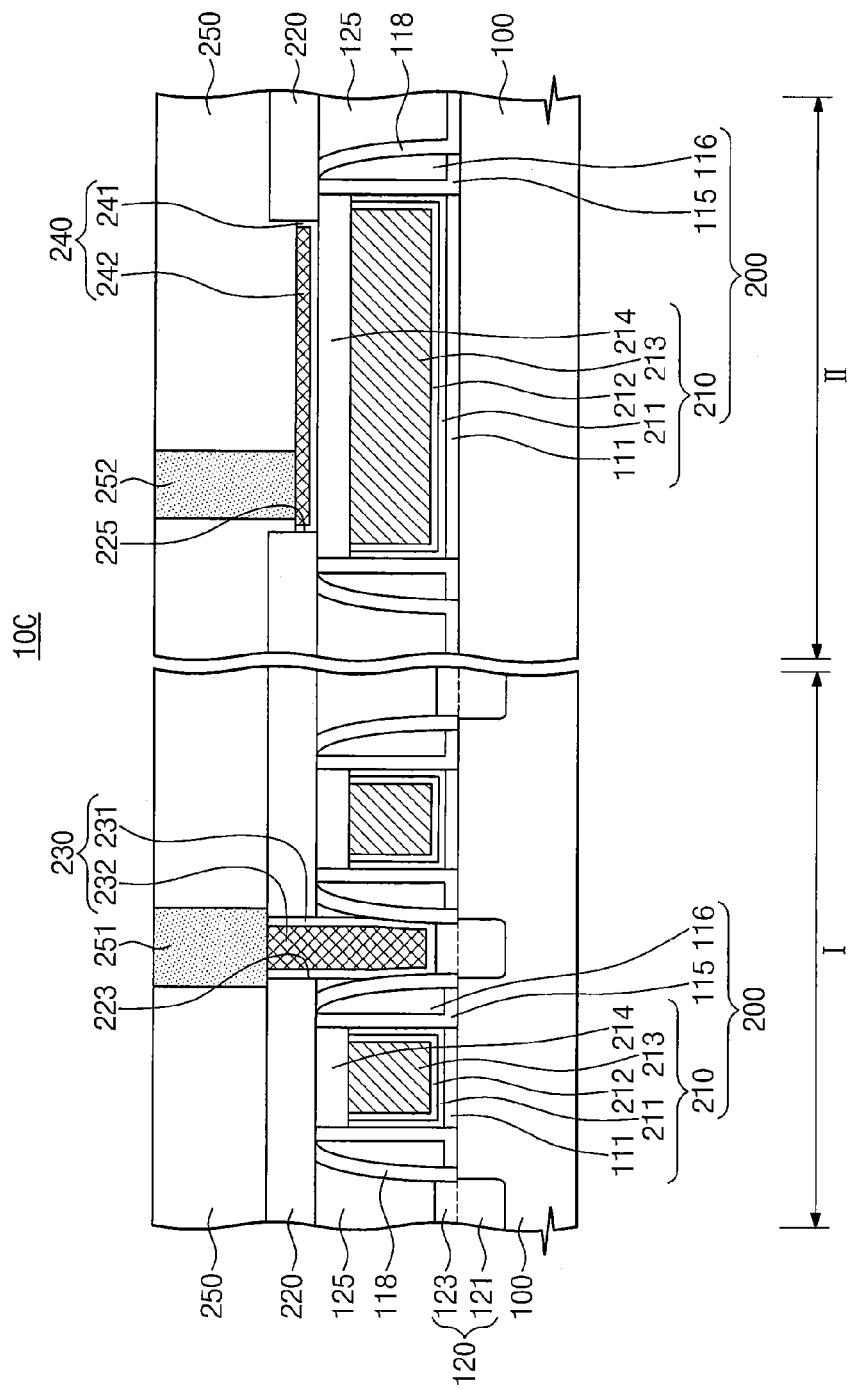

FIGS. 2 through 4 are sectional views taken along the lines I-I' and of FIG. 1 to illustrate semiconductor devices according to example embodiments of the inventive concept.

Referring to FIGS. 1 and 2, a semiconductor device 10A may include the first region I provided with a transistor TR and the second region II provided with the resistor pattern 240. The first region I may include the gate structure 200, the source/drain region 120, the source/drain contact plug 230, and the first interconnection plug 251, which are provided on a substrate 100. The second region II may include the gate structure 200, the resistor pattern 240, and the second interconnection plug 252, which are provided on the substrate 100.

The substrate 100 may be or include a bulk silicon wafer or a silicon on insulator (SOI) wafer.

The gate structure 200 may include a gate electrode 210, an inner gate spacer 115, and an outer gate spacer 116. The gate electrode 210 may include a gate insulating pattern 111, a high-k dielectric pattern 211, a gate barrier pattern 212, a gate conductive pattern 213, and a gate capping pattern 214, which are sequentially stacked on the substrate 100.

The gate insulating pattern 111 may be provided on the substrate 100 to extend in a horizontal direction. For example, the gate insulating pattern 111 may be formed to have a "-" or rotated "I"-shaped cross-section when viewed in cross section. In some embodiments, the gate insulating pattern 111 may have a line-shaped cross-section extending along an upper surface of the substrate 100. The gate insulating pattern 111 may be formed of or include a silicon oxide layer.

The high-k dielectric pattern 211 may be formed on the gate insulating pattern 111 to cover bottom and side surfaces of the gate barrier pattern 212. In other words, the high-k dielectric pattern 211 may have a "U"-shaped cross-section. The high-k dielectric pattern 211 may be formed of or include at least one metal oxides (e.g., hafnium oxide (HfO), lanthanum oxide (LaO), and aluminum oxide (AlO)).

The gate barrier pattern 212 may be formed on inner side and bottom surfaces of the high-k dielectric pattern 211 to surround the gate conductive pattern 213. For example, the gate barrier pattern 212 may have a "U"-shaped cross-section. The gate barrier pattern 212 may be formed of or include at least one of materials having a good diffusion-preventing property (e.g., titanium (Ti), titanium nitride (TiN), tantalum (Ta), tantalum nitride (TaN), or titanium tungsten (TiW)).

The gate conductive pattern 213 may be formed to fill a space defined by the gate barrier pattern 212. The gate conductive pattern 213 may be formed of or include at least one of metallic materials (e.g., tungsten, copper, nickel, cobalt, aluminum, titanium, or tantalum) or metal compounds (e.g., metal nitrides). The gate conductive pattern 213 may be formed to have a multi-layered structure. For example, the gate conductive pattern 213 may include at least two layers selected from the group consisting of metal layers, alloy layers, and metal compound layers.

The gate capping pattern 214 may be formed to cover a top surface of the gate conductive pattern 213. The gate capping pattern 214 may be formed of or include a silicon nitride layer or a silicon oxynitride layer.

The inner gate spacer 115 may be formed to cover outer side surfaces of the gate insulating pattern 111, the high-k dielectric pattern 211, and the gate capping pattern 214. The inner gate spacer 115 may further include a portion extending in a horizontal direction and covering a top surface of the substrate 100, thereby having an "L"-shaped cross-section. The inner gate spacer 115 may be formed of or include a silicon oxide layer. In example embodiments, the inner gate spacer 115 may have a top surface that is coplanar with the top surface of the gate capping pattern 214.

The outer gate spacer 116 may be formed on the inner gate spacer 115. The outer gate spacer 116 may be formed of or include a silicon nitride layer or a silicon oxynitride layer. In example embodiments, the outer and inner gate spacers 116 and 115 may be formed to have top surfaces that are positioned at the same level.

The source/drain region 120 may be formed adjacent to the outer gate spacer 116. The source/drain region 120 may include a lower source/drain region 121 formed in the substrate 100, and an upper source/drain region 123, which is formed on the lower source/drain region 121 and is positioned at a higher level than the top surface of the substrate 100. The source/drain region 120 may be doped with impurity atoms (e.g., phosphorus (P), arsenic (As), or boron (B)). The source/drain region 120 may be formed in the first region I provided with the transistor TR and may not be formed in the second region II.

The gate structure 200 and the source/drain region 120 adjacent thereto may form one transistor TR. In the case where the source/drain region 120 is doped with p-type impurities (e.g., boron), the transistor TR may serve as a p-channel metal oxide semiconductor (PMOS) transistor. In the case where the source/drain region 120 is doped with n-type impurities (e.g., phosphorus or arsenic), the transistor TR may serve as an n-channel metal oxide semiconductor (NMOS) transistor.

A capping insulating layer 118 may be formed on the outer gate spacer 116. The capping insulating layer 118 may be formed of or include a silicon oxide layer or a silicon nitride layer. In the first region I, the capping insulating layer 118 may be disposed between the outer gate spacer 116 and the source/drain region 120. The capping insulating layer 118 may be in direct contact with the outer gate spacer 116 and the upper source/drain region 123. In the second region II, the capping insulating layer 118 may be disposed to extend from the outer gate spacer 116 to the substrate 100. The capping insulating layer 118 may be in direct contact with the outer gate spacer 116 and the substrate 100.

A first interlayered insulating layer 125 may be provided between the gate structures 200 to cover side surfaces of the capping insulating layer 118 and a top surface of the source/drain region 120. The first interlayered insulating layer 125 may have a top surface that is substantially coplanar with that of the gate structure 200. The first interlayered insulating layer 125 may be formed of or include a silicon oxide layer.

A second interlayered insulating layer 220 may be provided to cover the top surfaces of the gate structure 200 and the first interlayered insulating layer 125. The second interlayered insulating layer 220 may be formed of or include a silicon oxide layer.

In the first region I, the source/drain contact plug 230 may be formed to vertically penetrate the second interlayered insulating layer 220 and the first interlayered insulating layer 125 and be in contact with the upper source/drain region 123. The source/drain contact plug 230 may include a contact barrier pattern 231 and a contact conductive pattern 232. The contact barrier pattern 231 may be formed on the upper source/drain region 123 to conformally cover an inner surface of a source/drain contact hole 223. The contact barrier pattern 231 may be formed of or include at least one of barrier metals (for example, titanium (Ti), titanium nitride (TiN), tantalum (Ta), tantalum nitride (TaN), or titanium tungsten (TiW)). The contact conductive pattern 232 may be formed on the contact barrier pattern 231 to fill the source/drain contact hole 223. The contact conductive pattern 232 may be formed of or include at least one of metallic materials (e.g., tungsten, copper, nickel, cobalt, aluminum, titanium, or tantalum) or metal compounds (e.g., metal nitrides).

In the second region II, the resistor pattern 240 may be formed to penetrate the second interlayered insulating layer 220 and may be disposed on the gate capping pattern 214 of the gate structure 200. The resistor pattern 240 may extend along the X- and/or Y-directions on the gate structure 200. The resistor pattern 240 may include a resistor barrier pattern 241 and a resistor conductive pattern 242. The resistor barrier pattern 241 may be formed to conformally cover an inner surface of a trench 225 exposing the gate capping pattern 214.

The resistor conductive pattern 242 may be formed on the resistor barrier pattern 241 to fill the trench 225. The resistor barrier pattern 241 and the resistor conductive pattern 242 may be formed of or include the same materials as the contact barrier pattern 231 and the contact conductive pattern 232, respectively.

The resistor pattern 240 may be formed to have a top surface that is coplanar with that of the source/drain contact plug 230.

A third interlayered insulating layer 250 may be formed to cover the top surfaces of the resistor pattern 240 and the second interlayered insulating layer 220. The third interlayered insulating layer 250 may be formed of or include a silicon oxide layer.

In the first region I, the first interconnection plug 251 may be formed to penetrate the third interlayered insulating layer 250 and be in contact with the source/drain contact plug 230. In the second region II, the second interconnection plug 252 may be formed to penetrate the third interlayered insulating layer 250 and be in contact with the resistor pattern 240. The first interconnection plug 251 and the second interconnection plug 252 may have bottom surfaces that are coplanar with each other. The first interconnection plug 251 and the second interconnection plug 252 may be formed of or include at least one of metallic materials (e.g., tungsten, copper, nickel, cobalt, aluminum, titanium, or tantalum) or metal compounds (e.g., metal nitrides).

Referring to FIGS. 1 and 3, a semiconductor device 10B may include the first region I provided with the transistor TR and the second region II provided with the resistor pattern 240. The first region I may include the gate structure 200, the source/drain region 120, the source/drain contact plug 230, and the first interconnection plug 251, which are provided on the substrate 100. The second region II may include the gate structure 200, the resistor pattern 240, and the second interconnection plug 252, which are provided on the substrate 100.

In the first region I, the source/drain contact plug 230 may be formed to partially fill the source/drain contact hole 223, which is formed to vertically penetrate the second interlayered insulating layer 220 and the first interlayered insulating layer 125, and may be in contact with the upper source/drain region 123. According to the present embodiments, the source/drain contact plug 230 may have a top surface that is positioned at a lower level than that of the second interlayered insulating layer 220. The source/drain contact plug 230 may include the contact barrier pattern 231 and the contact conductive pattern 232. The contact barrier pattern 231 may be formed on the upper source/drain region 123 to cover an inner surface of the source/drain contact hole 223. The contact conductive pattern 232 may be formed on the contact barrier pattern 231 to fill a portion of the source/drain contact hole 223.

In the second region II, the resistor pattern 240 may be formed to partially fill the trench 225, which is formed to penetrate the second interlayered insulating layer 220, and may be disposed on the gate capping pattern 214 of the gate structure 200. The resistor pattern 240 may have a top surface that is positioned at a lower level than that of the second interlayered insulating layer 220. The resistor pattern 240 may include the resistor barrier pattern 241 and the resistor conductive pattern 242. The resistor barrier pattern 241 may be formed on the gate capping pattern 214 to cover a lower portion of the trench 225. The resistor conductive pattern 242 may be formed on the resistor barrier pattern 241 to fill a portion of the trench 225. The resistor pattern 240 may be formed to have a top surface that is coplanar with that of the source/drain contact plug 230.

The third interlayered insulating layer 250 may be formed to cover the top surfaces of the resistor pattern 240 and the second interlayered insulating layer 220 and a portion of a side surface of the second interlayered insulating layer 220.

In the first region I, the first interconnection plug 251 may be formed to penetrate an upper portion of the second interlayered insulating layer 220 and the third interlayered insulating layer 250 and be in contact with the source/drain contact plug 230.

In the second region II, the second interconnection plug 252 may be formed to penetrate the third interlayered insulating layer 250 and be in contact with the resistor pattern 240. The second interconnection plug 252 may have a bottom surface that is positioned at a lower level than the top surface of the second interlayered insulating layer 220.

Other elements of the semiconductor device 10B may be configured to have substantially the same features as those of the semiconductor device 10A described with reference to FIG. 2.

Referring to FIGS. 1 and 4, a semiconductor device 10C may include the first region I provided with the transistor TR and the second region II provided with the resistor pattern 240. The first region I may include the gate structure 200, the source/drain region 120, the source/drain contact plug 230, and the first interconnection plug 251, which are provided on the substrate 100. The second region II may include the gate structure 200, the resistor pattern 240, and the second interconnection plug 252, which are provided on the substrate 100.

In the first region I, the source/drain contact plug 230 may be formed to vertically penetrate the second interlayered insulating layer 220 and the first interlayered insulating layer 125 and be in contact with the upper source/drain region 123. The top surfaces of the source/drain contact plug 230 and the second interlayered insulating layer 220 may be positioned at the same level.

In the second region II, the resistor pattern 240 may be formed to partially fill the trench 225, which is formed to penetrate the second interlayered insulating layer 220, and may be disposed on the gate capping pattern 214 of the gate structure 200. The resistor pattern 240 may have a top surface that is positioned at a lower level than that of the second interlayered insulating layer 220. The resistor pattern 240 may include a resistor barrier pattern 241 and a resistor conductive pattern 242. The resistor barrier pattern 241 may be formed on the gate capping pattern 214 to cover a lower portion of the trench 225. The resistor conductive pattern 242 may be formed on the resistor barrier pattern 241 to fill a portion of the trench 225. The resistor pattern 240 may be formed to have a top surface that is positioned at a different level from that of the source/drain contact plug 230. For example, the top surface of the source/drain contact plug 230 may be positioned at a higher level than the top surface of the resistor pattern 240.

The third interlayered insulating layer 250 may be formed to cover the top surfaces of the resistor pattern 240 and the second interlayered insulating layer 220 and a portion of a side surface of the second interlayered insulating layer 220.

In the second region II, the second interconnection plug 252 may be formed to penetrate the third interlayered insulating layer 250 and be in contact with the resistor pattern 240. The second interconnection plug 252 may have a bottom surface that is positioned at a lower level than the top surface of the second interlayered insulating layer 220.

Other elements of the semiconductor device 10C may be configured to have substantially the same features as those of the semiconductor device 10A described with reference to FIG. 2.

The semiconductor devices 10A, 10B, and 10C according to example embodiments of the inventive concept may include the resistor pattern 240 that is formed using the process for forming the gate structure 200 and the source/drain contact plug 230. Accordingly, it may be possible to simplify the fabrication process of the semiconductor device.

Figure 5A:
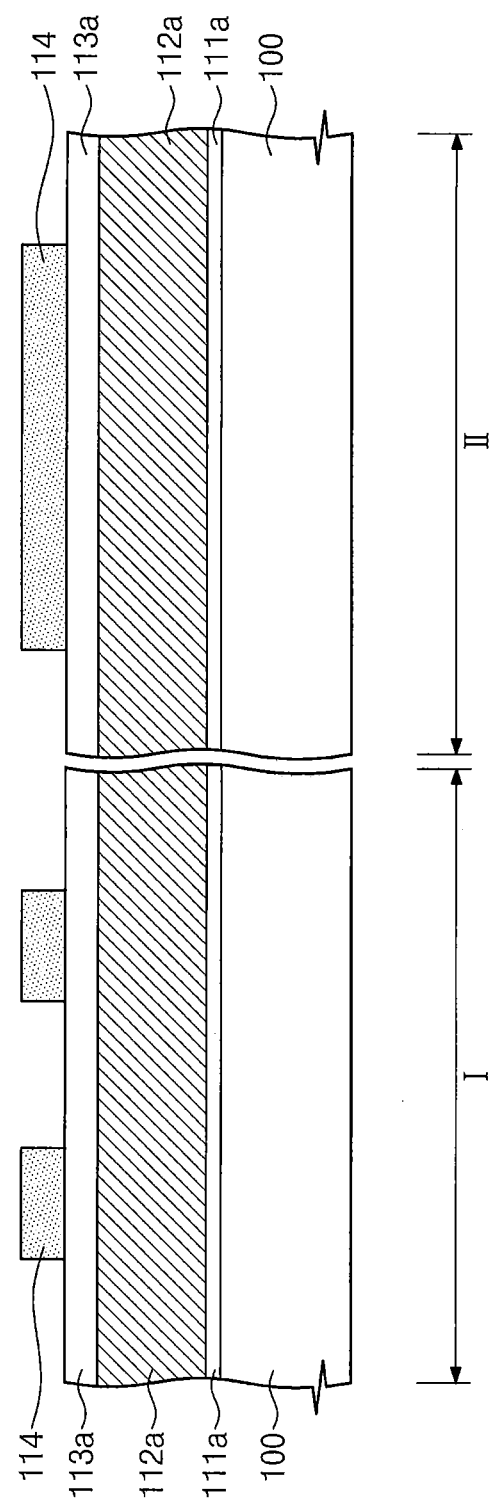
FIGS. 5A through 5P are sectional views taken along the lines I-I' and II-II' of FIG. 1 to illustrate a method of fabricating a semiconductor device according to example embodiments of the inventive concept.
Figure 5B:
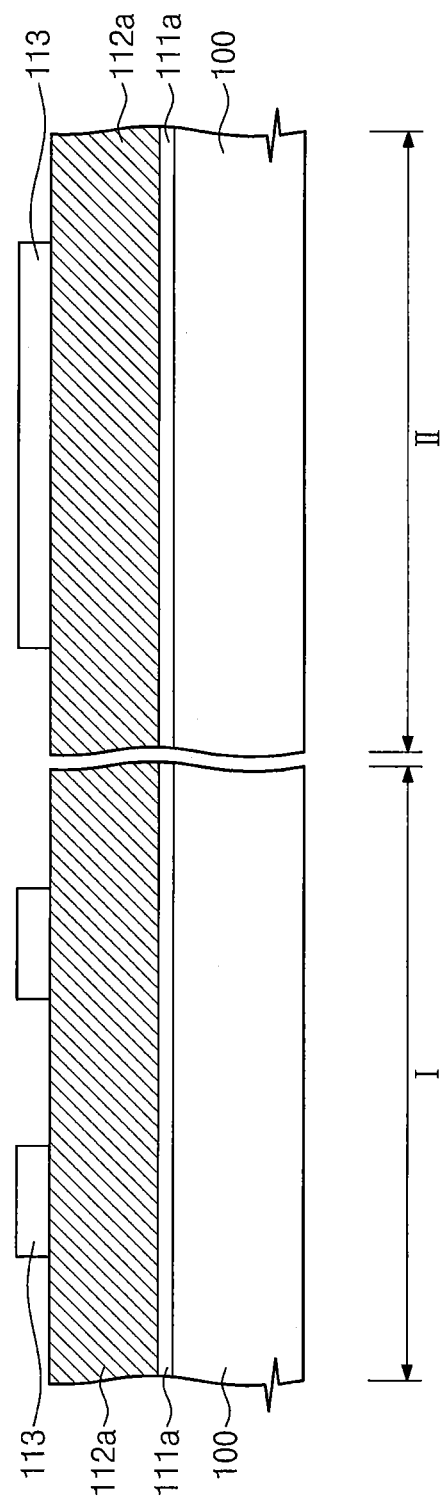
Figure 5D:
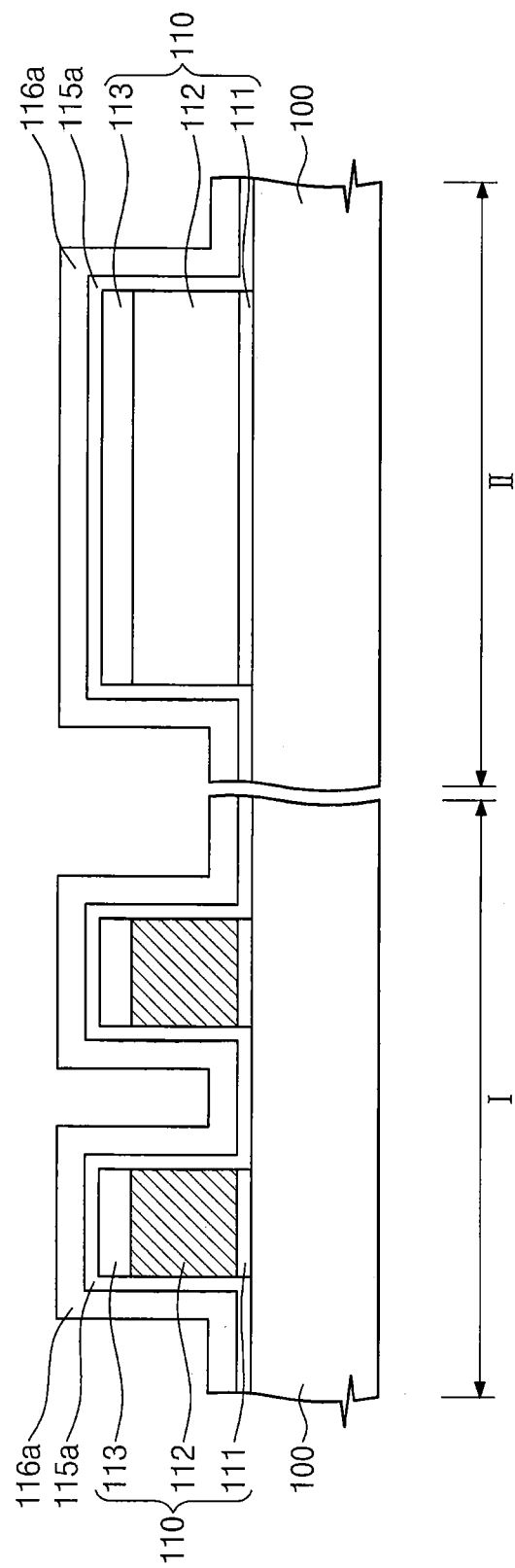
Figure 5F:
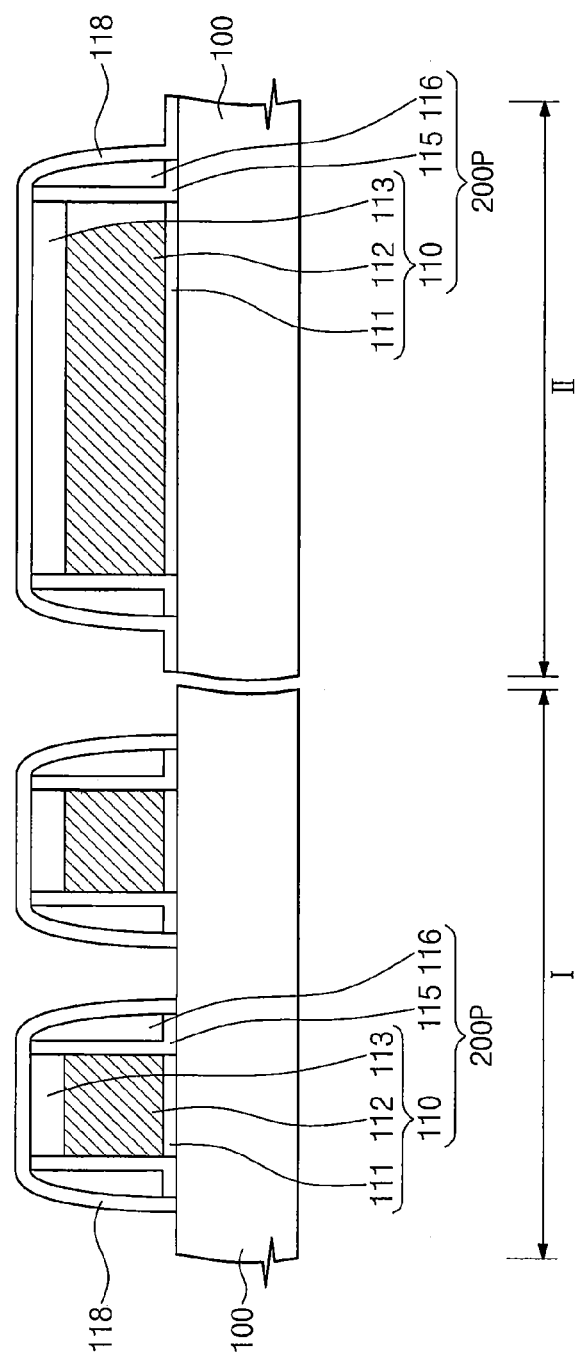
Figure 5G:
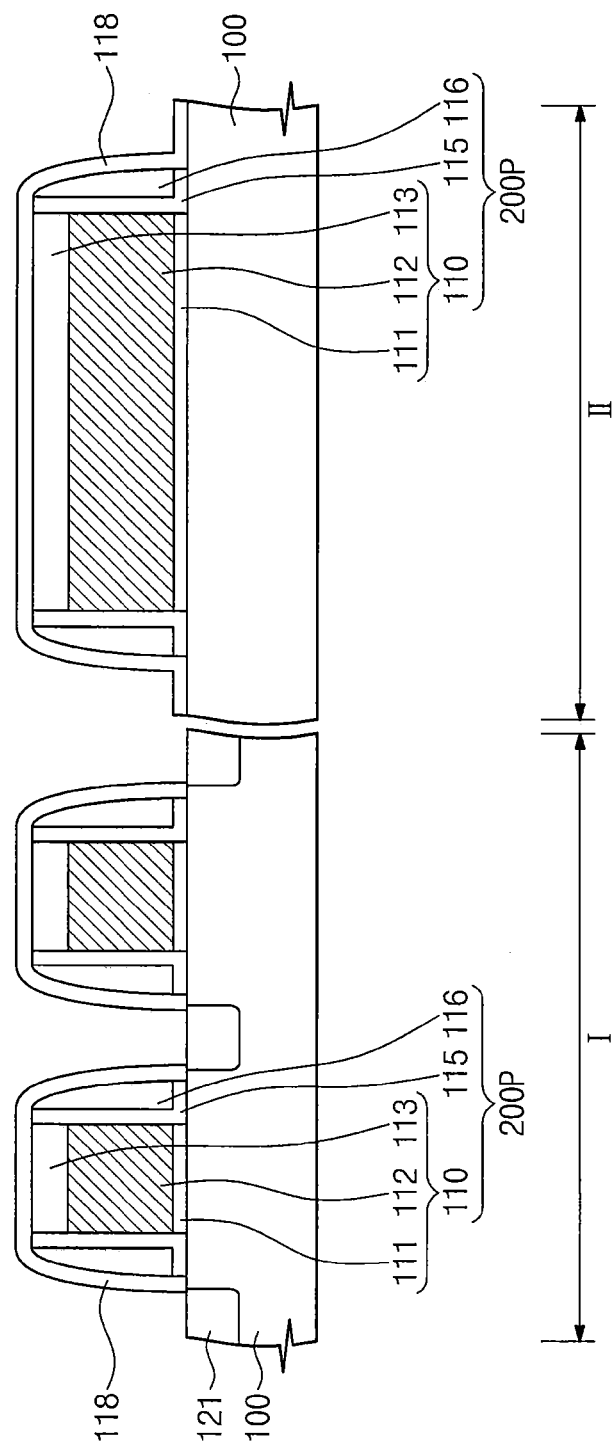
Figure 5H:
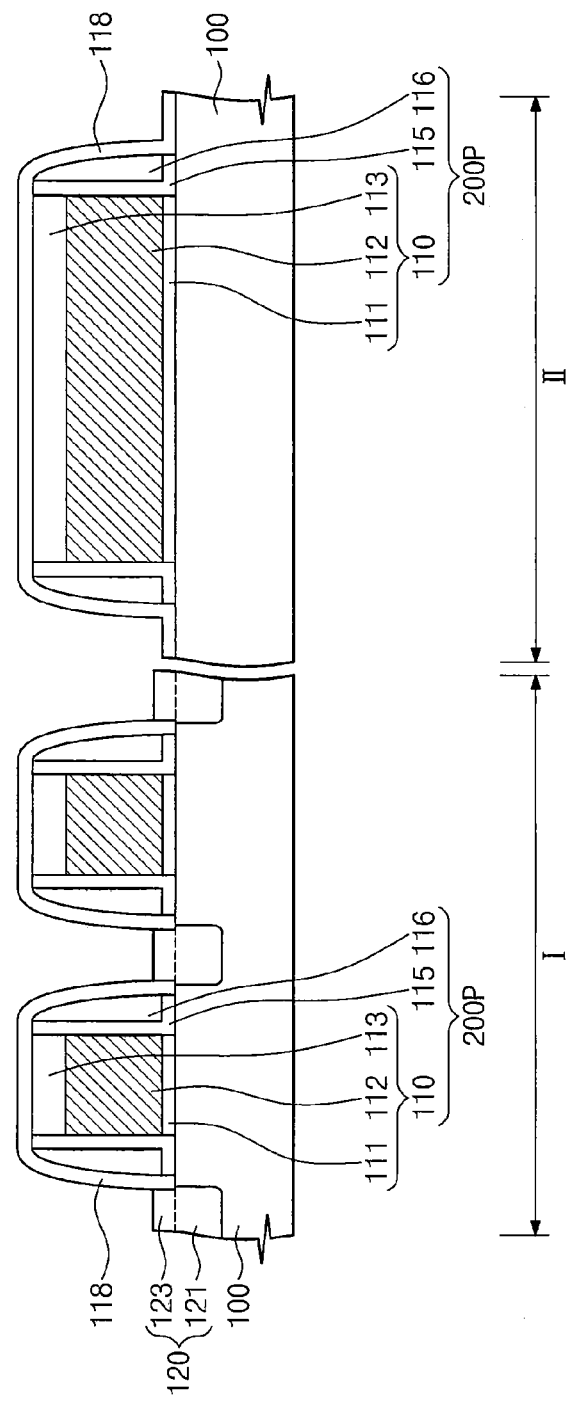
Figure 5I:
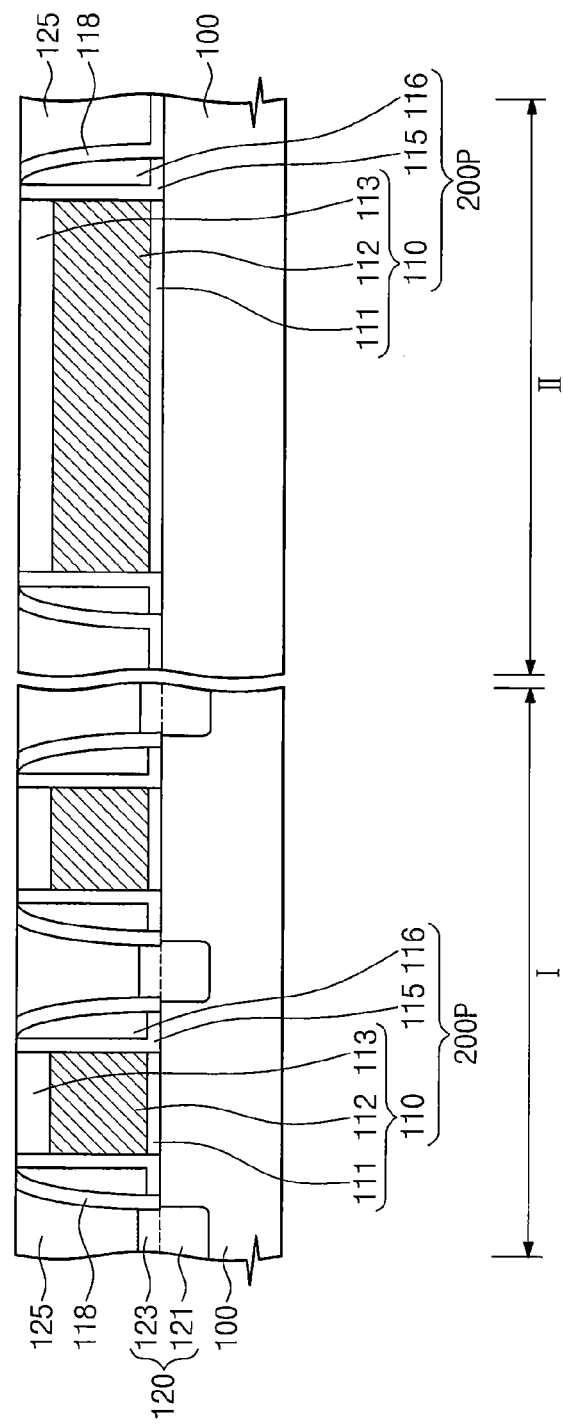
Figure 5J:
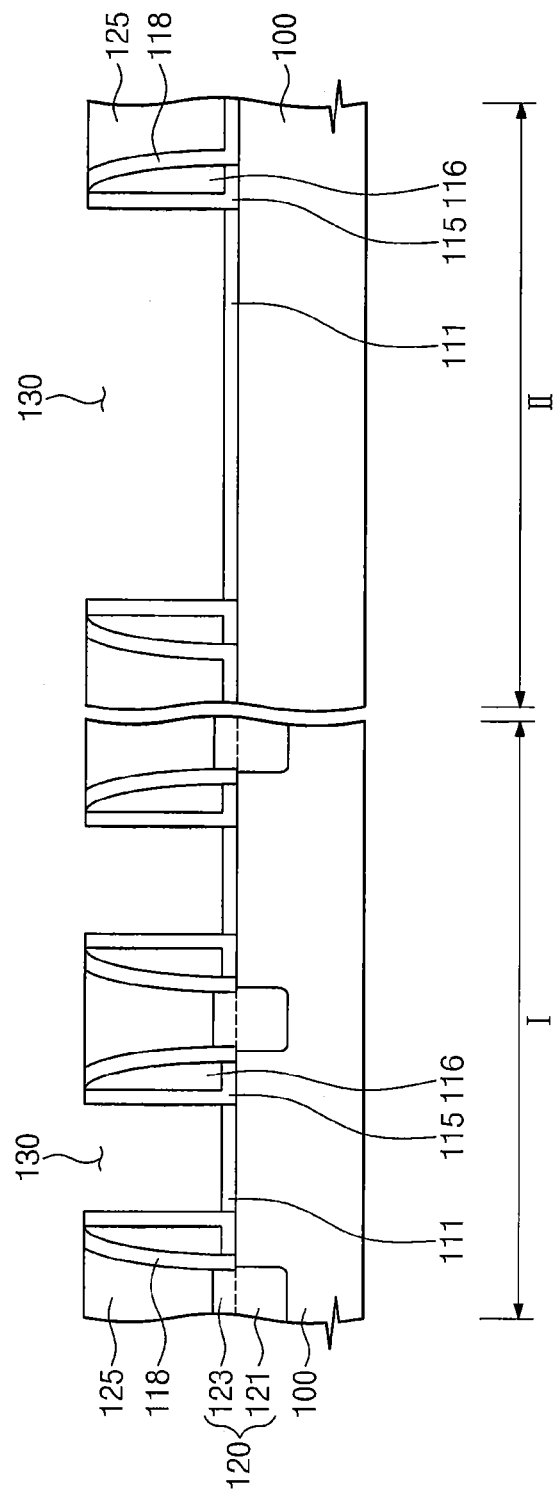
Figure 5K:
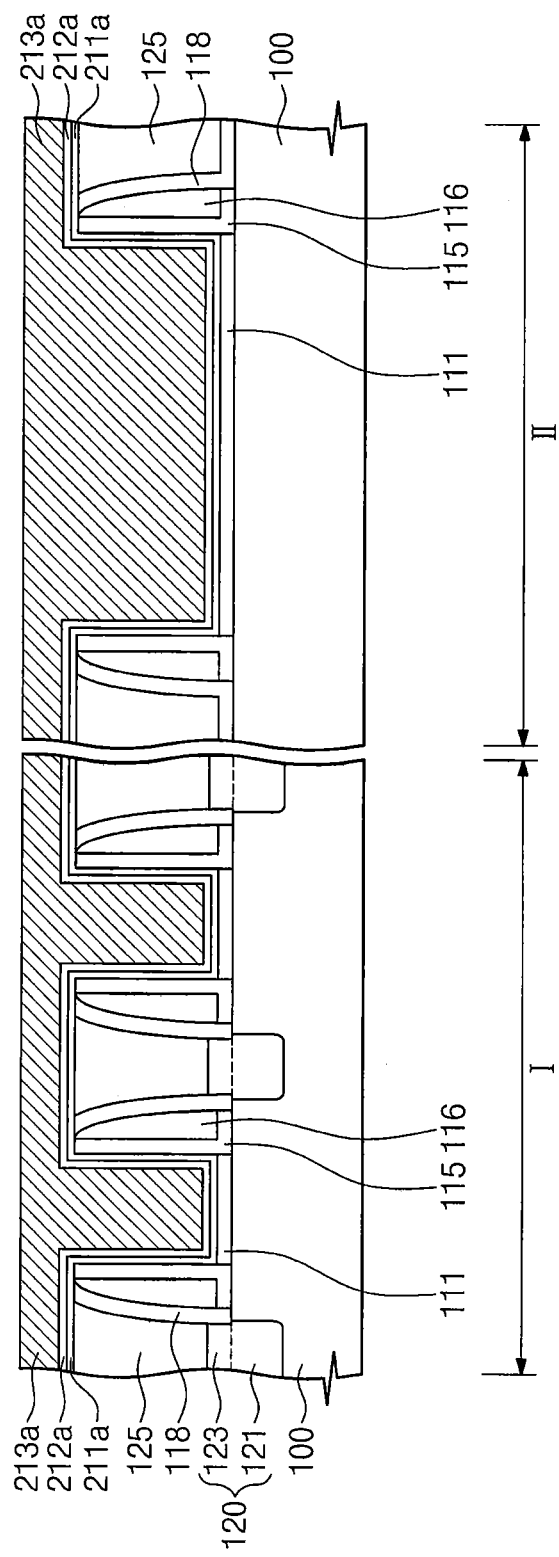
Figure 5L:
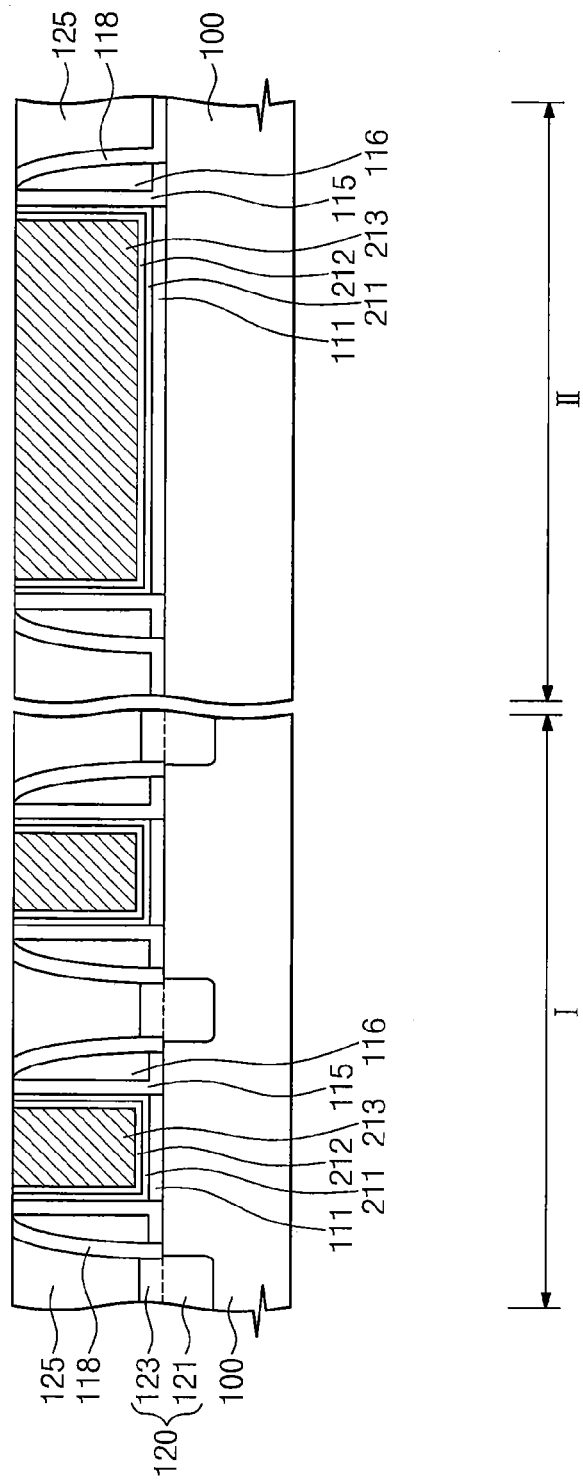
Figure 5M:
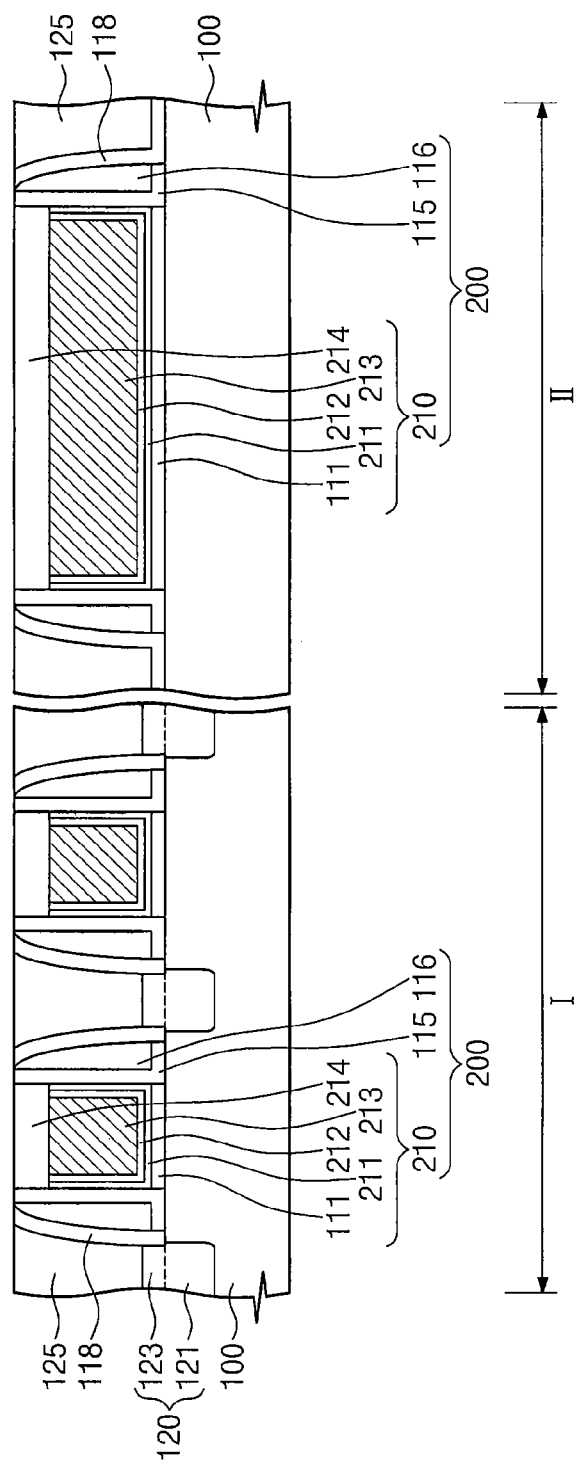
Figure 50:
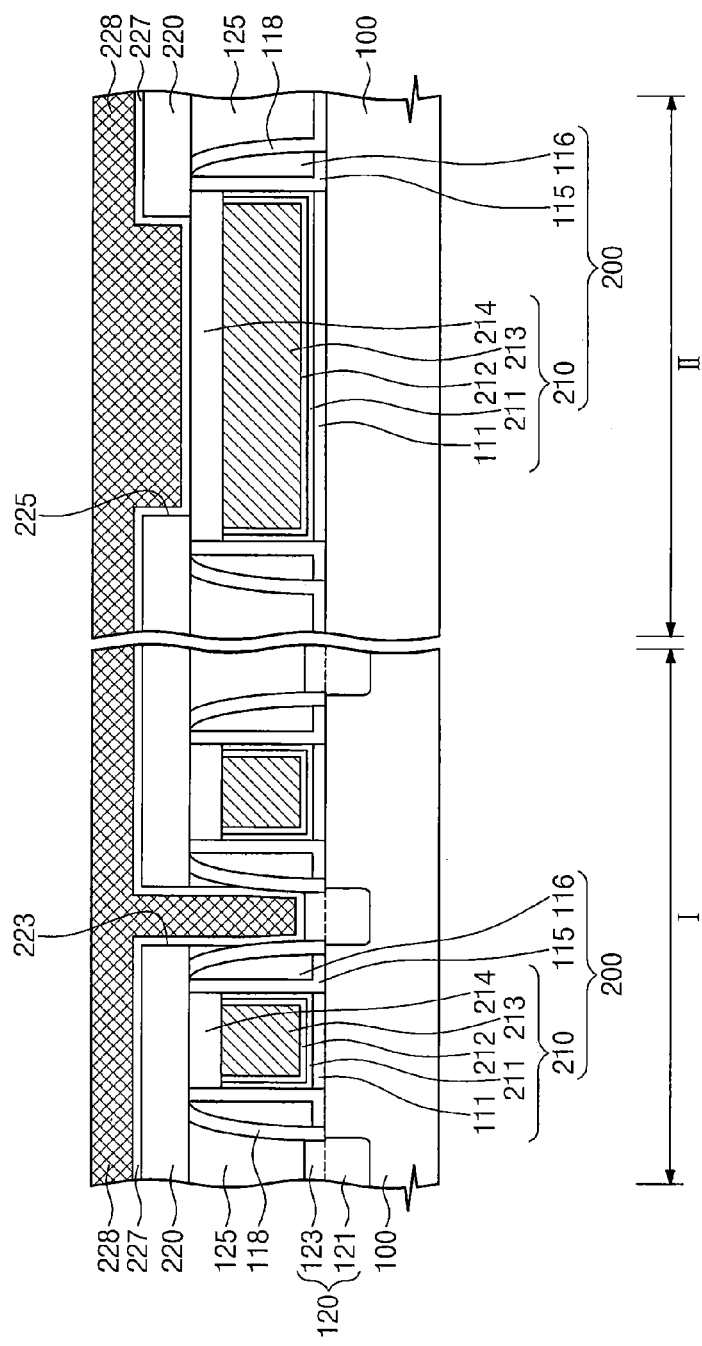
Figure 5P:
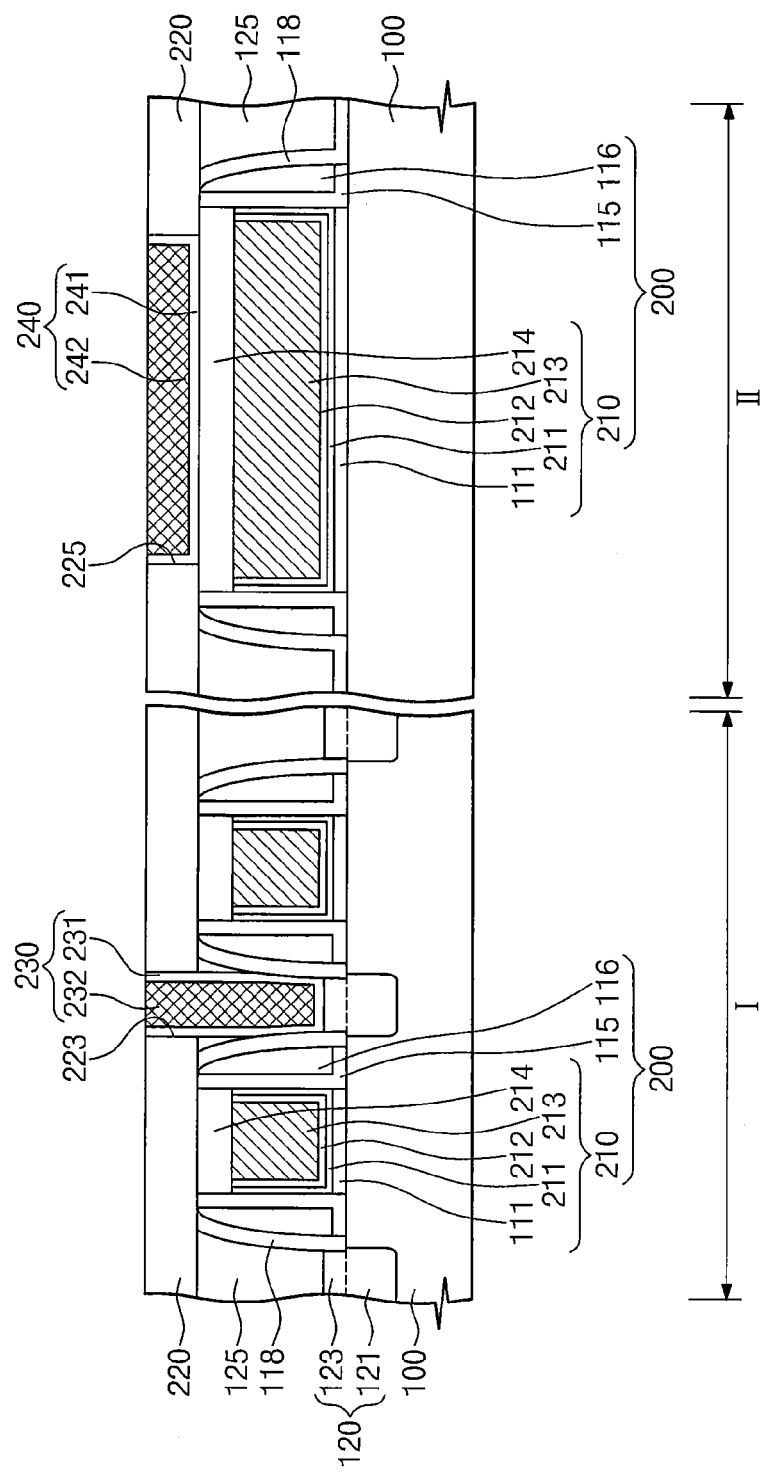

FIGS. 5A through 5P are sectional views taken along the lines I-I' and II-II' of FIG. 1 to illustrate a method of fabricating the semiconductor device 10A of FIG. 2.

Referring to FIG. 5A, a gate insulating layer 111a, a gate sacrificial layer 112a, and a hard mask layer 113a may be sequentially formed on the substrate 100. First etch mask patterns 114 may be formed on the hard mask layer 113a.

The substrate 100 may include the first region I, on which a transistor will be formed, and the second region II, on which the resistor pattern 240 will be formed. The substrate 100 may be or include a bulk silicon wafer or a silicon-on-insulator (SOI) wafer. The gate insulating layer 111a may be a silicon oxide layer formed on the substrate 100 using a thermal oxidation process. The gate sacrificial layer 112a may be a poly silicon layer or an amorphous silicon layer formed on the gate insulating layer 111a using, for example, a chemical vapor deposition (CVD) process. The hard mask layer 113a may be a silicon nitride layer deposited on the gate sacrificial layer 112a using, for example, a CVD process. The first etch mask pattern 114 may be formed to include a photoresist pattern formed by a photolithography process.

Referring to FIG. 5B, the hard mask layer 113a may be etched using the first etch mask pattern 114 as an etch mask to form a hardmask pattern 113. Thereafter, the first etch mask pattern 114 may be removed.

Referring to FIG. 5C, the gate sacrificial layer 112a and the gate insulating layer 111a may be sequentially etched using an anisotropic etching process using the hardmask pattern 113 as an etch mask to form a gate sacrificial pattern 112 and the gate insulating pattern 111. The anisotropic etching process may be performed to expose the top surface of the substrate 100, and thus, preliminary gate electrodes 110 may be formed on the first region I and the second region II. Here, each of the preliminary gate electrodes 110 may include the gate insulating pattern 111, the gate sacrificial pattern 112, and the hardmask pattern 113.

Referring to FIG. 5D, an inner spacer layer 115a and an outer spacer layer 116a may be formed on the substrate 100 to cover the preliminary gate electrodes 110. The formation of the inner spacer layer 115a may include performing a deposition process to form a silicon oxide layer covering the substrate 100 with the preliminary gate electrodes 110. The formation of the outer spacer layer 116a may include performing a deposition process to form a silicon nitride layer conformally covering the inner spacer layer 115a.

Referring to FIG. 5E, an etch-back process may be performed to sequentially etch the outer and inner spacer layers 116a and 115a and thereby form the inner gate spacer 115 and the outer gate spacer 116 on sidewalls of the preliminary gate electrode 110. Accordingly, preliminary gate structures 200P, each of which includes the preliminary gate electrode 110, the inner gate spacer 115 and the outer gate spacer 116, may be formed on the substrate 100.

Referring to FIG. 5F, the capping insulating layer 118 may be formed on the substrate 100 to cover the preliminary gate structures 200P. In the first region I, the capping insulating layer 118 may be formed in such a way that the top surface of the substrate 100 is exposed between the preliminary gate structures 200P. For example, a photolithography process may be used to remove portions of the capping insulating layer 118 between the preliminary gate structures 200P and thereby expose the top surface of the substrate 100. In the second region II, the top surface of the substrate 100 may be covered with the capping insulating layer 118. The capping insulating layer 118 may be one of a silicon nitride layer, a silicon oxynitride layer, or a silicon oxide layer, which is conformally formed using a deposition process such as CVD process.

Referring to FIG. 5G, the exposed portions of the substrate 100 in the first region I may be doped with impurities to form the lower source/drain regions 121. The formation of the lower source/drain regions 121 may include an ion implantation process or an ion diffusion process, which is performed to inject at least one of the group III or IV elements (e.g., phosphorus (P), arsenic (As), or boron (B)) into the substrate 100. In example embodiments, the lower source/drain region 121 may be formed to have a bottom surface that is positioned below the top surface of the substrate 100.

Referring to FIG. 5H, the upper source/drain regions 123 may be formed on the lower source/drain regions 121, respectively. The upper and lower source/drain regions 123 and 121 may constitute the source/drain region 120. The upper source/drain regions 123 may be formed using a selective epitaxial growth process. For example, the upper source/drain region 123 may include an epitaxially grown single crystalline silicon layer. The upper source/drain regions 123 may be formed to protrude upward from the top surface of the substrate 100 and be in contact with the capping insulating layer 118. Further, the upper source/drain regions 123 may be formed to have the same conductivity type as the lower source/drain regions 121. In certain embodiments, a metal silicide layer, which serves as at least a part of the upper source/drain region 123, may be formed in a subsequent process. For example, the formation of the upper source/drain region 123 may include forming a metal layer (e.g., of nickel, cobalt, tungsten, or titanium) on the epitaxially grown single crystalline silicon layer, and performing a silicidation process on the structure provided with the metal layer. During the silicidation process, the entire or partial portion of the upper source/drain region 123 may be used to form the metal silicide layer, such as nickel silicide, cobalt silicide, tungsten silicide, or titanium silicide.

Referring to FIG. 5I, the first interlayered insulating layer 125 may be formed on the upper source/drain region 123 and the capping insulating layer 118, and then, a chemical mechanical polishing (CMP) process may be performed to expose the hardmask patterns 113 of the preliminary gate structures 200P. The first interlayered insulating layer 125 may include a silicon oxide layer, which may be formed using a CVD process.

Referring to FIG. 5J, the hardmask patterns 113 and the gate sacrificial patterns 112 of the preliminary gate structures 200P may be removed to form recess regions 130. Each of the recess regions 130 may be defined by the gate insulating pattern 111 and the inner gate spacer 115. In some embodiments, the gate insulating patterns 111 may be removed when the hardmask patterns 113 and gate sacrificial patterns 112 are removed. The removal of the hardmask patterns 113 may be performed by a dry or wet etching process. In the case of the dry etching process, an etching gas containing carbon (C) and fluorine (F) (e.g., $CF_4$, $C_2F_6$, $C_3F_6$, or $C_4F_8$) and/or an etching gas containing carbon (C), hydrogen (H), and fluorine (F) (e.g., $CHF_3$) may be used to remove the hardmask patterns 113. In the case of the wet etching process, phosphoric acid ($H_3PO_4$) may be used to remove the hardmask patterns 113. The gate sacrificial patterns 112 may be removed by a dry etching process using chlorine ions ($Cl^-$) or chlorine radicals ($Cl^*$).

Referring to FIG. 5K, a high-k dielectric 211a and a gate barrier layer 212a may be sequentially formed on inner surfaces of the recess regions 130 and the top surface of the first interlayered insulating layer 125, and then, a gate conductive layer 213a may be formed on the gate barrier layer 212a to fill the space of the recess region 130. In some embodiments, the gate conductive layer 213a may completely fill the space of the recess region 130. The formation of the high-k dielectric 211a may include conformally forming at least one metal oxide layer (e.g., of hafnium oxide (HfO), lanthanum oxide (LaO), or aluminum oxide (AlO)) using a deposition process. The formation of the gate barrier layer 212a may include conformally forming at least one barrier metal layer (e.g., of titanium (Ti), titanium nitride (TiN), tantalum (Ta), tantalum nitride (TaN), or titanium tungsten (TiW)) using a deposition process. The formation of the gate conductive layer 213a may include forming at least one metal layer (e.g., of tungsten, copper, nickel, cobalt, aluminum, titanium, or tantalum) and/or at least one metal compound layer (e.g., of metal nitride) in the remaining space of the recess region 130 and on the first interlayered insulating layer 125, using a deposition process.

Referring to FIG. 5L, a CMP process may be performed to remove the high-k dielectric 211a, the gate barrier layer 212a, and the gate conductive layer 213a that are formed outside of the recess region 130. Accordingly, the high-k dielectric pattern 211, the gate barrier pattern 212, and the gate conductive pattern 213 may be formed in each of the recess regions 130. The CMP process may be performed to expose the first interlayered insulating layer 125.

Referring to FIG. 5M, the high-k dielectric pattern 211, the gate barrier pattern 212, and the gate conductive pattern 213 may be selectively etched to form a vertically recessed region in the recess region 130, and then, the gate capping pattern 214 serving as a part of the gate structure 200 may be formed in the vertically recessed region. Here, the gate structure 200 may include the gate electrode 210, the inner gate spacer 115, and the outer gate spacer 116. The gate electrode 210 may include the gate insulating pattern 111, the high-k dielectric pattern 211, the gate barrier pattern 212, the gate conductive pattern 213, and the gate capping pattern 214. The formation of the gate capping pattern 214 may include sequentially performing a deposition process and a CMP process to fill the vertically recessed region with, for example, a silicon nitride layer.

The gate structure 200 and the source/drain region 120 formed on the first region I of the substrate 100 may constitute one transistor. The source/drain region 120 may not be formed on the second region II of the substrate 100. In other words, the gate structure 200 formed on the second region II may serve as a dummy gate structure because it may not be used as a gate electrode of a normal transistor.

Referring to FIG. 5N, the second interlayered insulating layer 220 may be formed to cover the first interlayered insulating layer 125 and the gate structure 200. A second etch mask pattern 221 may be formed on the second interlayered insulating layer 220. The second interlayered insulating layer 220 and/or the first interlayered insulating layer 125 may be etched using the second etch mask pattern 221 as an etch mask to concurrently form the source/drain contact hole 223 and the trench 225. The source/drain contact hole 223 may be formed to vertically penetrate the second interlayered insulating layer 220 and the first interlayered insulating layer 125 and expose the upper source/drain region 123, and the trench 225 may be formed to vertically penetrate the second interlayered insulating layer 220 and expose the gate capping pattern 214 of the gate structure 200. The etching process may be performed in an over-etch manner, and thus, the top surface of the gate capping pattern 214 may be partially recessed. In this case, the trench 225 may be formed to have a bottom surface that is positioned at a lower level than the top surface of the first interlayered insulating layer 125. The trench 225 may provide a space for the resistor pattern, which will be formed in a subsequent process. The trench 225 may be formed on the gate structure 200 to extend along the X and/or Y directions. The second interlayered insulating layer 220 may include a silicon oxide layer, which may be formed using a CVD process. The formation of the second etch mask pattern 221 may include performing a photolithography process to form a photoresist pattern. The second etch mask pattern 221 may be removed after the source/drain contact hole 223 and the trench 225 are formed.

Referring to FIG. 5O, a barrier layer 227 may be formed to conformally cover the source/drain contact hole 223 and the trench 225, and then, a conductive layer 228 may be formed on the barrier layer 227 to fill the source/drain contact hole 223 and the trench 225 provided with the barrier layer 227. The formation of the barrier layer 227 may include forming at least one barrier metal layer (e.g., of titanium (Ti), titanium nitride (TiN), tantalum (Ta), tantalum nitride (TaN), or titanium tungsten (TiW)) on an inner surface of the source/drain contact hole 223 using a CVD or sputtering process. The formation of the conductive layer 228 may include forming at least one metal layer (e.g., of tungsten, copper, nickel, cobalt, aluminum, titanium, or tantalum) and/or at least one metal compound layer (e.g., of metal nitride) using a deposition process.

Referring to FIG. 5P, a CMP process may be performed to concurrently form the source/drain contact plug 230 and the resistor pattern 240 in the source/drain contact hole 223 and the trench 225 respectively. The source/drain contact plug 230 may include the contact barrier pattern 231 and the contact conductive pattern 232. The resistor pattern 240 may include the resistor barrier pattern 241 and the resistor conductive pattern 242. The CMP process may be performed to expose the second interlayered insulating layer 220. The source/drain contact plug 230 and the resistor pattern 240 may include the same material. The source/drain contact plug 230 may be formed to have the top surface that is coplanar with that of the resistor pattern 240.

Referring again to FIG. 2, the third interlayered insulating layer 250 may be formed to cover the source/drain contact plug 230, the resistor pattern 240, and the second interlayered insulating layer 220. The first interconnection plug 251 and the second interconnection plug 252 may be formed to penetrate the third interlayered insulating layer 250 and be in contact with the source/drain contact plug 230 and the resistor pattern 240, respectively.

The third interlayered insulating layer 250 may include a silicon oxide layer, which may be formed using a CVD process. The formation of the first and second interconnection plugs 251 and 252 may include forming at least one metal layer (e.g., of tungsten, copper, nickel, cobalt, aluminum, titanium, or tantalum) and/or at least one metal compound layer (e.g., of metal nitride) using a CVD or sputtering process.

Figure 6:
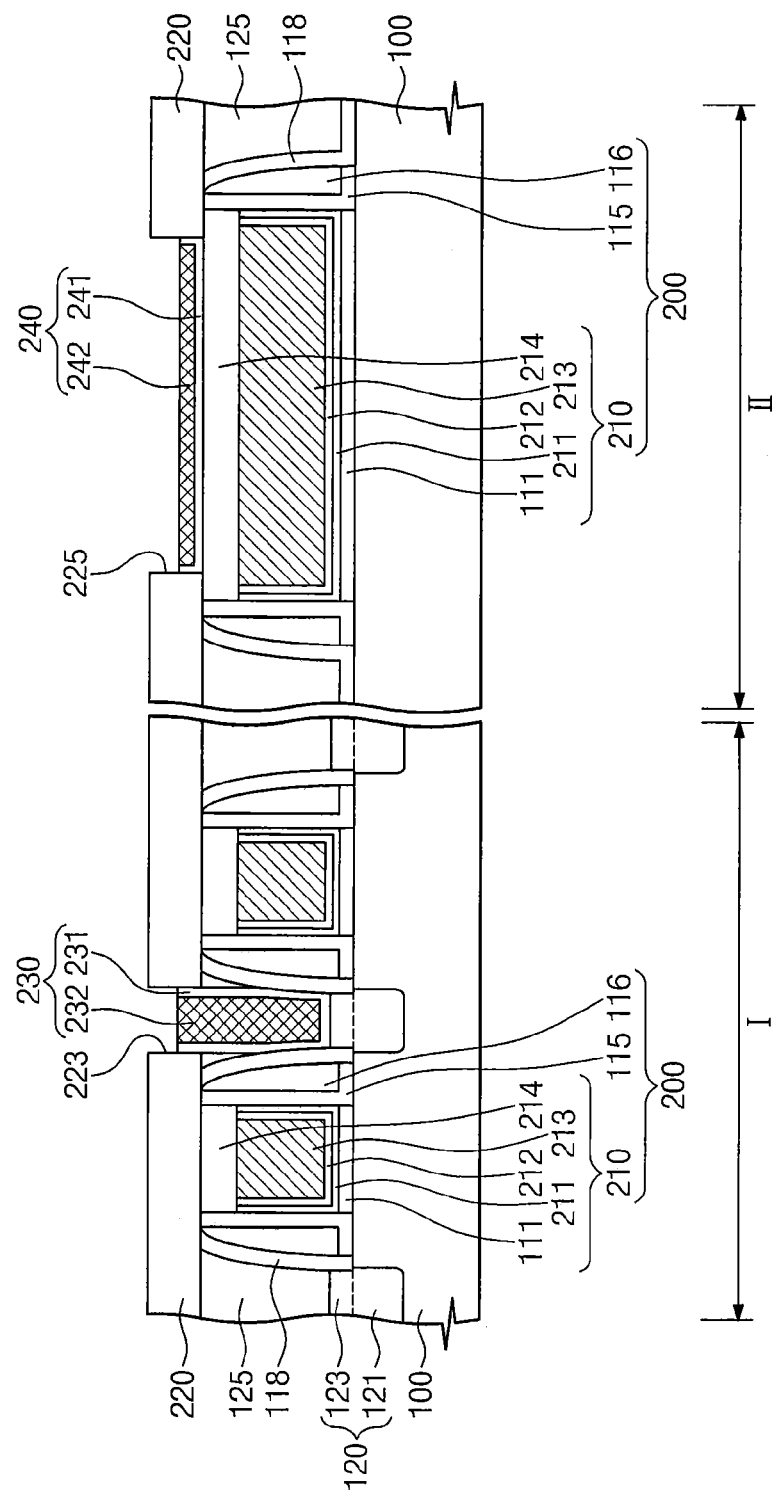
FIG. 6 is a sectional view taken along the lines I-I' and II-II' of FIG. 1 to illustrate a method of fabricating a semiconductor device according to example embodiments of the inventive concept.

FIG. 6 is a sectional view taken along the lines I-I' and II-II' of FIG. 1 to illustrate a method of fabricating the semiconductor device 10B of FIG. 3.

A method of fabricating the semiconductor device 10B may include process steps, which are performed in the same or similar manner as the method described with reference to FIGS. 5A through 5P.

The process steps described with reference to FIGS. 5A through 5P may be performed to fabricate the semiconductor device 10B.

Thereafter, as shown in FIG. 6, the source/drain contact plug 230 and the resistor pattern 240 may be selectively etched to have top surfaces lower than that of the second interlayered insulating 220. Since electric resistance of the resistor pattern 240 is dependent on a thickness of the resistor pattern 240, the electric resistance of the resistor pattern 240 can be changed by adjusting an etching amount of the resistor pattern 240. The top surfaces of the source/drain contact plug 230 and the resistor pattern 240 may be positioned at substantially the same level.

Referring again to FIG. 3, the third interlayered insulating layer 250 may be formed to cover the source/drain contact plug 230, the resistor pattern 240 and the second interlayered insulating layer 220. The first and second interconnection plugs 251 and 252 may be formed to penetrate the third interlayered insulating layer 250 and be in contact with the source/drain contact plug 230 and the resistor pattern 240, respectively.

Figure 7:
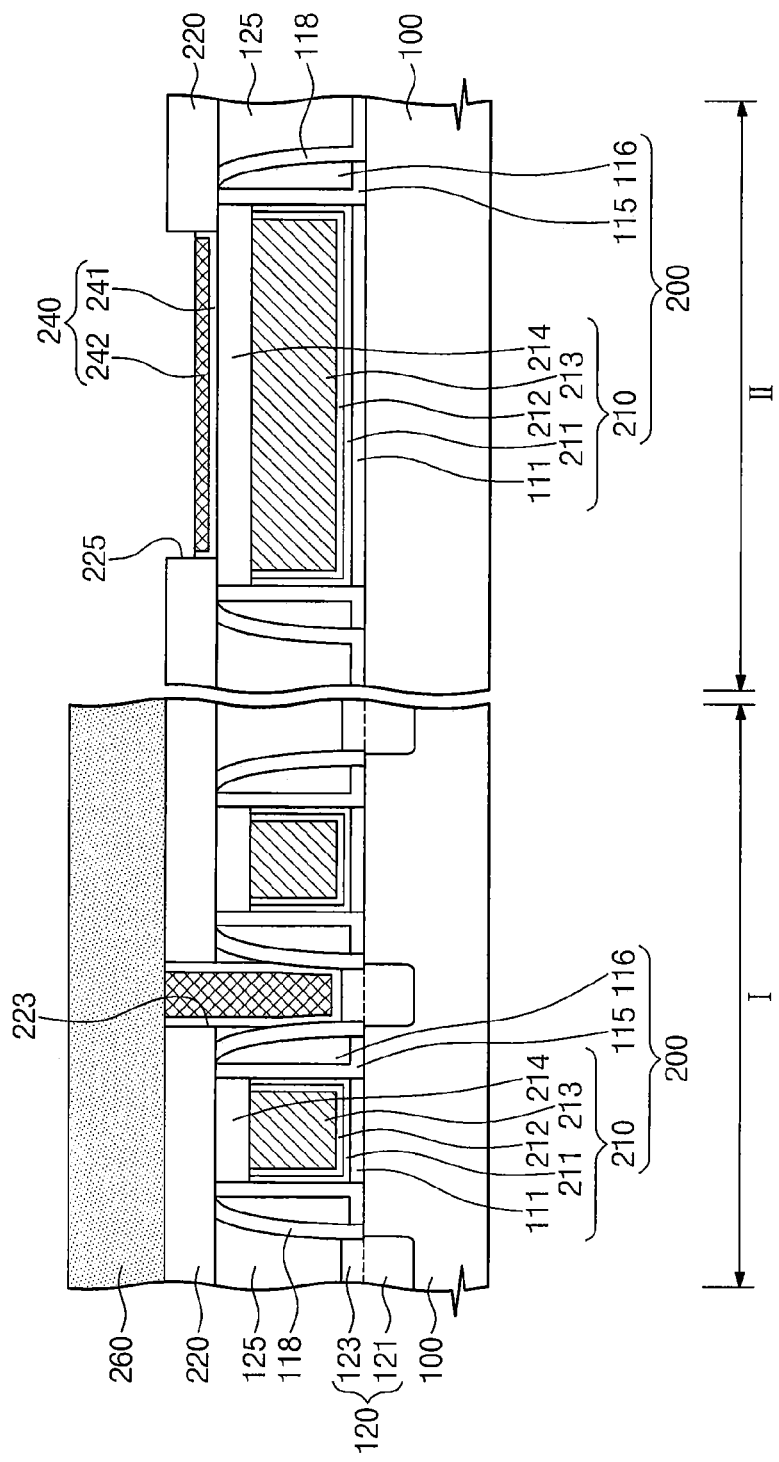
FIG. 7 is a sectional view taken along the lines I-I' and II-II' of FIG. 1 to illustrate a method of fabricating a semiconductor device according to example embodiments of the inventive concept.

FIG. 7 is a sectional view taken along the lines I-I' and II-II' of FIG. 1 to illustrate a method of fabricating the semiconductor device 10C of FIG. 4.

A method of fabricating the semiconductor device 10C may include process steps, which are performed in the same or similar manner as the method described with reference to FIGS. 5A through 5P.

The process steps described with reference to FIGS. 5A through 5P may be performed to fabricate the semiconductor device 10C.

Thereafter, as shown in FIG. 7, a third etch mask pattern 260 may be formed to cover the first region I and expose the second region II. The resistor pattern 240 may be selectively etched using the third etch mask pattern 260 as an etch mask. For example, the resistor pattern 240 may be formed to have the top surface that is lower than that of the second interlayered insulating layer 220. Since electric resistance of the resistor pattern 240 is dependent on a thickness of the resistor pattern 240, the electric resistance of the resistor pattern 240 can be changed by adjusting an etching amount of the resistor pattern 240. As a result of the use of the third etch mask pattern 260, the top surface of the source/drain contact plug 230 may be formed at a higher level than the top surface of the resistor pattern 240. Thereafter, the third etch mask pattern 260 may be removed.

Referring again to FIG. 4, the third interlayered insulating layer 250 may be formed to cover the source/drain contact plug 230, the resistor pattern 240, and the second interlayered insulating layer 220. The first and second interconnection plugs 251 and 252 may be formed to penetrate the third interlayered insulating layer 250 and be in contact with the source/drain contact plug 230 and the resistor pattern 240, respectively.

According to example embodiments of the inventive concept, in the fabrication of the semiconductor devices 10A, 10B, and 10C, the source/drain contact plug 230 and the resistor pattern 240 may be simultaneously formed using process steps for forming the gate structure 200P and the source/drain contact plug 230. That is, it is possible to form the resistor pattern 240 without adding process steps and consequently simplify a process of fabricating the semiconductor device. Further, by performing an etching process for achieving a desired thickness of the resistor pattern 240, it may be possible to form the resistor pattern 240 with desired electric resistance.

Figure 8A:
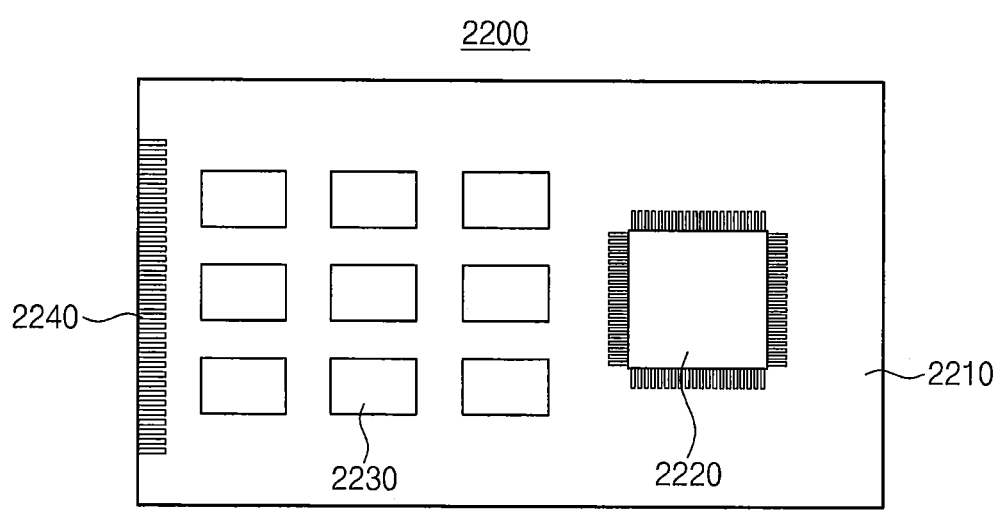
FIG. 8A is a diagram schematically showing a semiconductor module including a semiconductor device in accordance with various embodiments of the inventive concept.

FIG. 8A is a diagram schematically showing a semiconductor module 2200 including a semiconductor device in accordance with various embodiments of the inventive concept. Referring to FIG. 8A, the semiconductor module 2200 may include a module substrate 2210 and a microprocessor 2220 mounted thereon. The semiconductor module 2200 may further include at least one semiconductor chip 2230. Input/output terminals 2240 may be arranged on at least one edge of the module substrate 2210. The microprocessor 2220 and/or the semiconductor chip 2230 may include at least one of the semiconductor devices in accordance with various embodiments of the inventive concept.

Figure 8B:
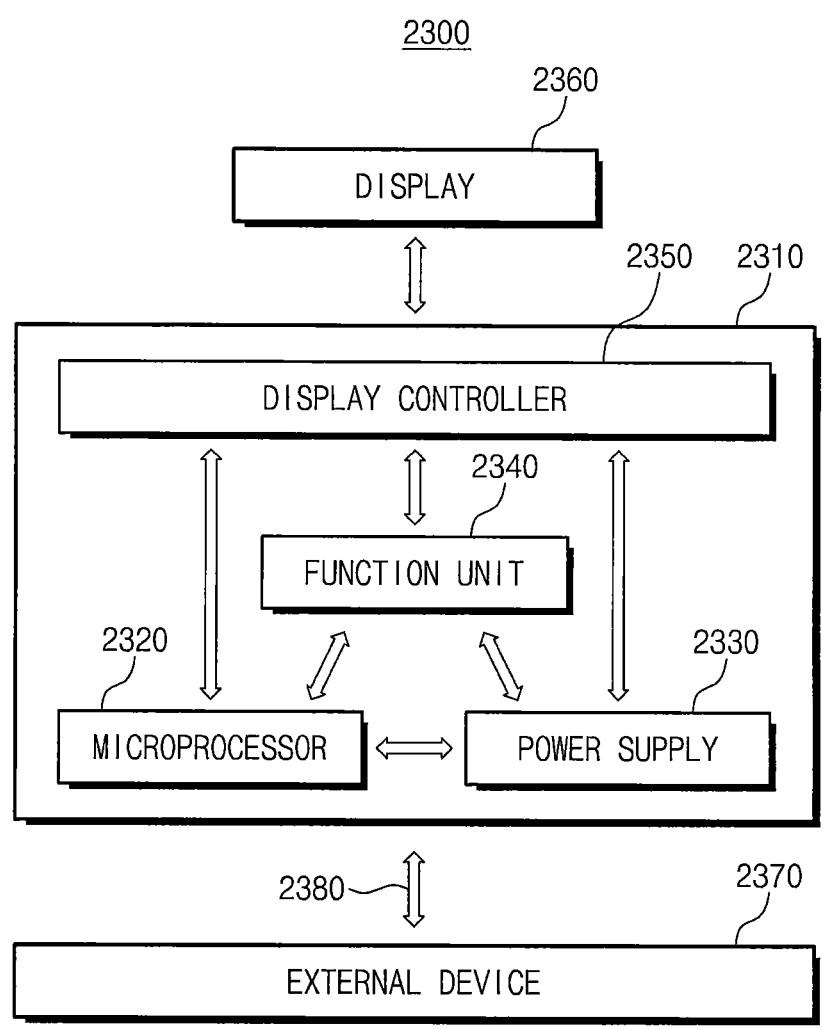
FIGS. 8B and 8C are block diagrams schematically showing electronic systems including a semiconductor device in accordance with various embodiments of the inventive concept.

FIG. 8B is a block diagram schematically showing an electronic system 2300 including a semiconductor device in accordance with various embodiments of the inventive concept. Referring to FIG. 8B, the electronic system 2300 may include a body 2310. The body 2310 may include a microprocessor 2320, a power supply 2330, a function unit 2340, and/or a display controller 2350. The body 2310 may be a system board or a motherboard, which may be provided in the form of, for example, a printed circuit board (PCB). The microprocessor 2320, the power supply 2330, the function unit 2340, and the display controller 2350 may be mounted or installed on the body 2310. A display 2360 may be provided on a top surface or an outside of the body 2310. For example, the display 2360 may be provided on a surface of the body 2310 and display image processed by the display controller 2350. The power supply 2330 may be configured to transform a constant voltage supplied from an external power source to various voltage levels, which will be supplied to the microprocessor 2320, the function unit 2340, and/or the display controller 2350. The microprocessor 2320 may receive a voltage from the power supply 2330 to control the function unit 2340 and the display 2360. The function unit 2340 may perform various functions of the electronic system 2300. For example, in the case where the electronic system 2300 is a mobile electronic product such as a mobile phone, the function unit 2340 may include several components for performing dialing, image displaying, voice and sound outputting, wireless communication, and so forth. Further, in the case where the electronic system 2300 includes a camera, the function unit 2340 may be configured to serve as an image processor. In some embodiments, the electronic system 2300 may be connected to or include a memory card, and the function unit 2340 may be configured to serve as a memory card controller. The function unit 2340 may exchange signals with the external device 2370 via a wired or wireless communication unit 2380. In addition, in the case where the electronic system 2300 includes a universal serial bus (USB), the function unit 2340 may be configured to serve as an interface controller. The semiconductor devices in accordance with various embodiments of the inventive concept may be included in at least one of the microprocessor 2320 and the function unit 2340.

Figure 8C:
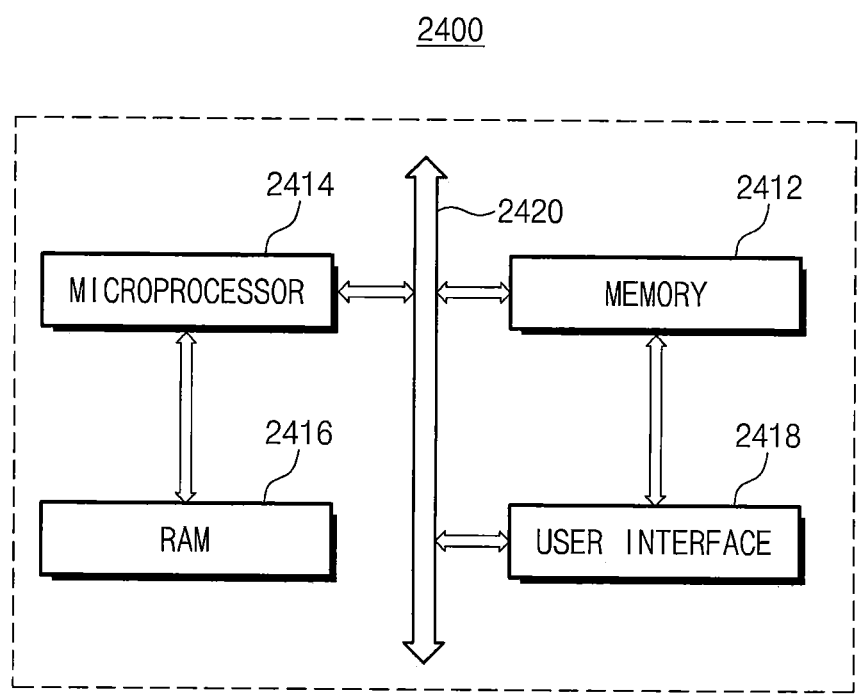

FIG. 8C is a block diagram schematically showing an electronic system 2400 including a semiconductor device in accordance with various embodiments of the inventive concept. Referring to FIG. 8C, the electronic system 2400 may be used to fabricate a mobile apparatus or a computer. For example, the electronic system 2400 may include a memory system 2412, a microprocessor 2414, a random access memory (RAM) 2416, and a user interface 2418, which are connected to each other via a bus 2420. The microprocessor 2414 may program and control the electronic system 2400. The RAM 2416 may be used as an operation memory of the microprocessor 2414. For example, the microprocessor 2414 or the RAM 2416 may include at least one of the semiconductor devices in accordance with the embodiments of the inventive concept. The microprocessor 2414, the RAM 2416, and/or other components may be assembled in a single package. The user interface 2418 may be used to input/output data to/from the electronic system 2400. The memory system 2412 may store codes for operating the microprocessor 2414, data processed by the microprocessor 2414, or external input data. The memory system 2412 may include a controller and a memory.

Figure 8D:
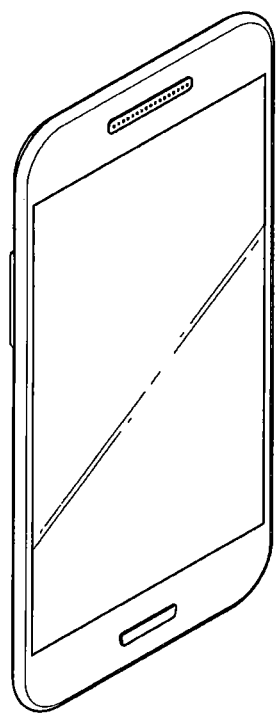
FIG. 8D is a diagram schematically showing a mobile apparatus including a semiconductor device in accordance with various embodiments of the inventive concept.

FIG. 8D is a view schematically showing a mobile apparatus 2500 including a semiconductor device in accordance with various embodiments of the inventive concept. The mobile apparatus 2500 may be provided in the form of a mobile phone or a tablet PC. In addition, at least one of the semiconductor devices in accordance with various embodiments of the inventive concept may be provided in the form of or may be used for a portable computer (e.g., a laptop computer), an MPEG-1 Audio Layer 3 (MP3) player, an MP4 player, a navigation system, a solid state disk (SSD), a desktop computer, automobile appliances, or home appliances, as well as a mobile phone or a tablet PC.

In a method of fabricating a semiconductor device, a metal-containing resistor pattern may be concurrently formed using a process of forming a gate structure and a contact plug, and thus, it is possible to simplify a process for fabricating a semiconductor device.

While example embodiments of the inventive concepts have been particularly shown and described, it will be understood by one of ordinary skill in the art that variations in form and detail may be made therein without departing from the spirit and scope of the attached claims. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device, comprising:
   a substrate;
   a first gate structure and a second gate structure on the substrate;
   a source/drain region adjacent to the first gate structure;
   an interlayered insulating layer on the source/drain region and the first and second gate structures, wherein the interlayered insulating layer comprises a first interlayered insulating layer and a second interlayered insulating layer on the first interlayered insulating layer;
   a source/drain contact hole extending through the interlayered insulating layer and exposing the source/drain region;
   a trench in the interlayered insulating layer, the trench exposing a top surface of the second gate structure;
   a source/drain contact plug in the source/drain contact hole and in contact with the source/drain region; and
   a resistor pattern in the trench and in contact with a top surface of the second gate structure.

2. The device of claim 1, wherein each of the first and second gate structures comprises a gate electrode, an inner gate spacer on a side surface of the gate electrode, and an outer gate spacer on a side surface of the inner gate spacer.

3. The device of claim 2, wherein the gate electrode comprises a gate insulating pattern, a high-k dielectric pattern, a gate barrier pattern, a gate conductive pattern and a gate capping pattern.

4. The device of claim 3, wherein the gate capping pattern is in direct contact with the resistor pattern.

5. The device of claim 1, wherein the source/drain region comprises a lower source/drain region and an upper source/drain region.

6. The device of claim 5, wherein the lower source/drain region is formed in the substrate and comprises impurity atoms.

7. The device of claim 5, wherein the upper source/drain region comprises a single crystalline silicon layer that is epitaxially grown from the lower source/drain region and protrudes upward from a top surface of the substrate.

8. The device of claim 1, wherein the first interlayered insulating layer has a top surface that is at a substantially equal level to top surfaces of the first and second gate structures.

9. The device of claim 1, wherein the second interlayered insulating layer has a top surface that is at a higher level than a top surface of the resistor pattern.

10. The device of claim 1, wherein the source/drain contact plug has a top surface that is at a substantially equal level to a top surface of the resistor pattern.

11. The device of claim 1, wherein the resistor pattern has a top surface that is at a lower level than a top surface of the source/drain contact plug.

12. The device of claim 1, wherein the source/drain contact plug and the resistor pattern comprises a material.

13. A semiconductor device, comprising:
a substrate;
a first gate structure and a second gate structure on the substrate;
a source/drain region adjacent to the first gate structure;
an interlayered insulating layer on the source/drain region and the first and second gate structures, the interlayered insulating layer comprising a first interlayered insulating layer and a second interlayered insulating layer on the first interlayered insulating layer;
a source/drain contact plug extending through the first and second interlayered insulating layers and being in contact with the source/drain region; and
a resistor pattern extending through the second interlayered insulating layer and being in contact with the second gate structure.

14. The device of claim 13, wherein the source/drain contact plug has a top surface that is at a substantially equal level to a top surface of the resistor pattern.

15. The device of claim 14, wherein the source/drain contact plug has a top surface that is at a lower level than a top surface of the second interlayered insulating layer.

16. The device of claim 13, wherein the source/drain region comprises a lower source/drain region and an upper source/drain region on the lower source/drain region.

17. The device of claim 16, wherein the upper source/drain region comprises a single crystalline silicon layer that is epitaxially grown from the lower source/drain region and protrudes upward from a top surface of the substrate.

18. The device of claim 13, wherein the resistor pattern has a top surface that is at a lower level than a top surface of the second interlayered insulating layer.

19. A semiconductor device, comprising:
a substrate including a first region and a second region;
a plurality of gate structures on the first and second regions;
a source/drain contact plug on the first region and between two of the plurality of gate structures; and
a resistor pattern on one of the plurality of gate structures of the second region,
wherein the source/drain contact plug has a top surface that is at a substantially equal level to a top surface of the resistor pattern.

\* \* \* \* \*